US006457654B1

(12) United States Patent
Glezer et al.

(10) Patent No.: US 6,457,654 B1
(45) Date of Patent: *Oct. 1, 2002

(54) MICROMACHINED SYNTHETIC JET ACTUATORS AND APPLICATIONS THEREOF

(75) Inventors: Ari Glezer, Atlanta, GA (US); Mark G. Allen, Atlanta, GA (US)

(73) Assignee: Georgia Tech Research Corporation, Atlanta, GA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/969,589

(22) Filed: Nov. 13, 1997

Related U.S. Application Data

(63) Continuation-in-part of application No. 08/489,490, filed on Jun. 12, 1995, now Pat. No. 5,758,823.

(51) Int. Cl.[7] .................... B05B 17/04; B05B 1/08

(52) U.S. Cl. .................... 239/4; 239/102.2

(58) Field of Search .................... 239/102.2, 99, 239/4; 417/413.1, 413.2

(56) References Cited

U.S. PATENT DOCUMENTS

| | | | |
|---|---|---|---|
| 1,485,715 A | 3/1924 | Robinson | |
| 1,878,088 A | 9/1932 | Zwikker | |
| 2,498,990 A | 2/1950 | Fryklund | |
| 2,591,083 A | 4/1952 | Maier | |
| 2,761,833 A | 9/1956 | Ward | 222/212 |
| 2,812,636 A | 11/1957 | Kadosch | |

(List continued on next page.)

FOREIGN PATENT DOCUMENTS

| | | |
|---|---|---|
| DE | 3320481 | 12/1984 |
| JP | 4-103494 | 4/1992 |
| SU | 590503 | 11/1974 |

OTHER PUBLICATIONS

Ingard et al., "Acoustic Nonlinearity of an Orifice," The Journal of Acoustical Society of America, vol. 42, No. 1, 1967, pp. 6–17.

(List continued on next page.)

*Primary Examiner*—David A. Scherbel
*Assistant Examiner*—Davis Hwu
(74) *Attorney, Agent, or Firm*—Thomas, Kayden, Horstemeyer & Risley

(57) ABSTRACT

The present invention involves micromachined synthetic jet actuators, or "microjet" actuators. These fluidic control devices may be fabricated using standard silicon micromachining techniques and comprise an orifice situated atop an actuator cavity which is bounded at least partially by a flexible membrane. Alternatively, microjets may be formed in more robust substrates, such as metals or ceramics. Vibration of the membrane using either electrostatic or piezoelectric drives results in a turbulent air jet formed normal to the microjet orifice. The jet stream is synthesized by a train of vortex rings. Each vortex is formed by the motion of the diaphragm and is advanced away from the jet under self-induced velocity. Alternatively, the microjet actuator can comprise a "piston in cylinder" to take the functional place of the vibrating diaphragm. This can be accomplished by changing the aspect ratio of the actuator cavity to a deeper, more cylindrical shape. A piston-like actuator can then be realized by using a "bossed" diaphragm. An improvement to microjets is the use of modulators with the jet actuators. Modulators are generally devices to selectively cover and uncover the orifice of a synthetic jet actuator in order to prevent either flow into or out of the jet cavity. Such modulators are fabricated as either vertical drive, lateral drive or constricting modulators.

27 Claims, 10 Drawing Sheets

39 10 16 13 11 30 14 12 18 CONTROL SYSTEM 24

U.S. PATENT DOCUMENTS

| | | | | | |
|---|---|---|---|---|---|
| 3,058,014 | A | | 10/1962 | Camp | |
| 3,262,658 | A | | 7/1966 | Reilly | 244/42 |
| 3,361,067 | A | | 1/1968 | Webb | |
| 3,425,058 | A | | 1/1969 | Babington | 239/434 X |
| 3,985,344 | A | | 10/1976 | McCord | |
| 4,131,505 | A | | 12/1978 | Davis, Jr. | |
| 4,171,852 | A | | 10/1979 | Haentjens | |
| 4,180,377 | A | | 12/1979 | Itakura | 417/413 |
| 4,206,831 | A | | 6/1980 | Welch et al. | |
| 4,261,689 | A | | 4/1981 | Takahashi | 417/417 |
| 4,363,991 | A | | 12/1982 | Edelman | |
| 4,369,857 | A | | 1/1983 | Frazer et al. | |
| 4,450,505 | A | | 5/1984 | Mittal et al. | 361/386 |
| 4,465,234 | A | | 8/1984 | Maehara et al. | |
| 4,473,185 | A | | 9/1984 | Peterson et al. | 239/8 |
| 4,495,947 | A | | 1/1985 | Motycka | 417/413 |
| 4,516,747 | A | | 5/1985 | Lurz | |
| 4,533,082 | A | | 8/1985 | Machara et al. | 239/4 |
| 4,533,255 | A | | 8/1985 | Gronholz et al. | |
| 4,548,240 | A | | 10/1985 | Graham | |
| 4,568,265 | A | | 2/1986 | Firey | |
| 4,611,553 | A | | 9/1986 | Iwata | |
| 4,635,749 | A | | 1/1987 | Tattersall | |
| 4,646,945 | A | | 3/1987 | Stiener et al. | 222/213 X |
| 4,667,877 | A | | 5/1987 | Yao et al. | |
| 4,693,201 | A | | 9/1987 | Williams et al. | |
| 4,697,769 | A | | 10/1987 | Blackwelder et al. | |
| 4,702,418 | A | * | 10/1987 | Carter et al. | 239/102.2 X |
| 4,747,523 | A | | 5/1988 | Dobbs | |
| 4,756,508 | A | * | 7/1988 | Giachino et al. | 239/102.2 X |
| 4,798,190 | A | | 1/1989 | Vaznaian et al. | |
| 4,802,642 | A | | 2/1989 | Mangiarotty | |
| 4,930,701 | A | | 6/1990 | Porter et al. | |
| 4,957,783 | A | | 9/1990 | Gabryszewski | |
| 5,034,688 | A | | 7/1991 | Moulene et al. | 361/385 |
| 5,040,560 | A | | 8/1991 | Glezer et al. | |
| 5,102,306 | A | | 4/1992 | Liu | 417/415 |
| 5,119,840 | A | | 6/1992 | Shibata | |
| 5,121,290 | A | | 6/1992 | Azar | 361/79 |
| 5,121,463 | A | | 6/1992 | Yoshihara | |
| 5,199,856 | A | | 4/1993 | Epstein et al. | |
| 5,203,362 | A | | 4/1993 | Shibata | |
| 5,238,153 | A | | 8/1993 | Castillo et al. | |
| 5,346,745 | A | | 9/1994 | Bandyopadhyay | |
| 5,365,490 | A | | 11/1994 | Katz | |
| 5,395,592 | A | | 3/1995 | Bolleman et al. | |
| 5,402,312 | A | | 3/1995 | Kinjo et al. | 165/109.33 X |
| 5,429,302 | A | | 7/1995 | Abbots | |
| 5,483,953 | A | * | 1/1996 | Cooper | 128/200.22 |
| 5,582,348 | A | | 12/1996 | Erickson | 239/8 X |
| 5,681,152 | A | | 10/1997 | Ahs | 417/413.2 |
| 5,742,954 | A | | 4/1998 | Idland | 4/541.1 |
| 5,758,823 | A | | 6/1998 | Glezer et al. | |
| 5,791,601 | A | | 8/1998 | Dancila et al. | 244/207 |
| 5,894,990 | A | * | 4/1999 | Glezer | 239/423 |
| 5,988,522 | A | * | 11/1999 | Glezer et al. | 239/11 |

OTHER PUBLICATIONS

Ingard et al., "Acoustic Circulation Effects and the Nonlinear Impedance of Orifices," The Journal of Acoustical Society of America, vol. 22, No. 2, Mar. 1950, pp. 211–218.

Mednikov et al., "Experimental Study of Intense Acoustic Streaming," Sov. Phys. Acoust., vol. 21, No. 2 Mar.–Apr. 1975, pp. 152–154.

Williams et al., "The Mechanism of Flow Control on a Cylinder with the Unstead Bleed Technique," AIAA 91–0039, Jan. 7–10, 1991.

Coe et al., "Micromachined Jets for Manipulation of Macro Flows," 1994 Solid–State Sensor and Actuator Workshop, Hilton Head, SC.

Hassan et al., "Effects of Zero–Mass "Synthetic"Jets on the Aerodynamics of the NACA–0012 Airfoil," AIAA 97–2326, 199.

AIAA–97–2326; Effects of Zero–Mass "Synthetic" Jets On The Aerodynamics Of The NACA–0012 Airfoil; Ahmed A. Hassan and Ram D. JanakiRam; 1997.

Lagorce et al., "Batch–Fabricated Microjet Coolers for Electronic Components," Int'l Symposium on Microelectronics, (SPIE vol. 3235), Oct. 14–16, 1997, pp. 494–499.

Coe et al., "Addressable Micromachined Jet Arrays," 8th Int'l Conference on Solid–State Sensors and Actuators (IEEE Cat. No. 95TH8173 vol. 2), Jun. 25–29, 1995, pp. 329–332.

* cited by examiner

MICROMACHINED SYNTHETIC JET ACTUATORS AND APPLICATIONS THEREOF

RELATED APPLICATION

This application is a continuation-in-part of application Ser. No. 08/489,490, filed on Jun. 12, 1995 now U.S. Pat. No. 5,758,823.

FIELD OF THE INVENTION

The present invention generally relates to fluid control devices and, more particularly, to micromachined synthetic jet actuators for controlling fluid flows though creation of a synthetic jet stream to interact with the fluid flow.

BACKGROUND OF THE INVENTION

The ability to manipulate and control the evolution of shear flows has tremendous potential for influencing system performance in diverse technological applications, including: mixing and combustion processes, lift and drag of aerodynamic surfaces, and thrust management. That these flows are dominated by the dynamics of a hierarchy of vortical structures, evolving as a result of inherent hydrodynamic instabilities (e.g., Ho & Huerre, 1984), suggests control strategies based on manipulation of these instabilities by the introduction of small disturbances at the flow boundary. A given shear flow is typically extremely receptive to disturbances within a limited frequency band and, as a result, these disturbances are rapidly amplified and can lead to substantial modification of the base flow and the performance of the system in which it is employed.

There is no question that suitable actuators having fast dynamic response and relatively low power consumption are the foundation of any scheme for the manipulation and control of shear flows. Most frequently, actuators have had mechanically moving, parts which come in direct contact with the flow [e.g., vibrating ribbons (Schubauer & Skramstad *J. Aero Sci.* 14 1947), movable flaps (Oster & Wygnanski, 1982), or electromagnetic elements (Betzig *AIAA,* 1981)]. This class of direct-contact actuators also includes piezoelectric actuators, the effectiveness of which has been demonstrated in flat plate boundary layers (Wehrmann 1967, and Jacobson & Reynolds *Stan. U. TF*-64 1995), wakes (Wehrmann *Phys. Fl.* 8 1965, 1967, and Berger *Phys. Fl. S*191 1967), and jets (Wiltse & Glezer 1993). Actuation can also be effected indirectly (and, in principle, remotely) either through pressure fluctuations [e.g., acoustic excitation (Crow & Champagne *JFM* 48 1971)] or body forces [e.g., heating (Liepmann et al. 1982, Corke & Mangano *JFM* 209 1989, Nygaard and Glezer 1991), or electromagnetically (Brown and Nosenchuck, *AIAA* 1995)].

Flow control strategies that are accomplished without direct contact between the actuator and the embedding flow are extremely attractive because the actuators can be conformally and nonintrusively mounted on or below the flow boundary (and thus can be better protected than conventional mechanical actuators). However, unless these actuators can be placed near points of receptivity within the flow, their effectiveness degrades substantially with decreasing power input. This shortcoming can be overcome by using fluidic actuators where control is effected intrusively using flow injection (jets) or suction at the boundary. Although these actuators are inherently intrusive, they share most of the attributes of indirect actuators in that they can be placed within the flow boundary and require only an orifice to communicate with the external flow. Fluidic actuators that perform a variety of "analog" (e.g., proportional fluidic amplifier) and "digital" (e.g., flip-flop) throttling and control functions without moving mechanical parts by using control jets to affect a primary jet within an enclosed cavity have been studied since the late 1950's (Joyce, *HDL-SR* 1983). Some of these concepts have also been used in open flow systems. Viets (*AIAA J.* 13 1975) induced spontaneous oscillations in a free rectangular jet by exploiting the concept of a flip-flop actuator and more recently, Raman and Cornelius (*AIAA J.* 33 1995) used two such jets to impose time harmonic oscillations in a larger jet by direct impingement.

More recently, a number of workers have recognized the potential for MEMS (micro electro mechanical systems) actuators in flow control applications for large scale systems and have exploited these devices in a variety of configurations. One of a number of examples of work in this area is that of Ho and his co-investigators (e.g., Liu, Tsao, Tai, and Ho, 1994) who have used MEMS versions of 'flaps' to effect flow control. These investigators have opted to modify the distribution of streamwise vorticity on a delta wing and thus the aerodynamic rolling moment about the longitudinal axis of the aircraft.

BACKGROUND TECHNOLOGY FOR SYNTHETIC JETS

It was discovered at least as early as 1950 that if one uses a chamber bounded on one end by an acoustic wave generating device and bounded on the other end by a rigid wall with a small orifice, that when acoustic waves are emitted at high enough frequency and amplitude from the generator, a jet of air that emanates from the orifice outward from the chamber can be produced. See, for example, Ingard and Labate, *Acoustic Circulation Effects and the Nonlinear Impedance of Orifices,* The Journal of the Acoustical Society of America, March, 1950. The jet is comprised of a train of vortical air puffs that are formed at the orifice at the generator's frequency.

The concern of scientists at that time was only with the relationship between the impedance of the orifice and the "circulation" (i.e., the vortical puffs, or vortex rings) created at the orifice. There was no suggestion to combine or operate the apparatus with another fluid stream in order to modify the flow of that stream (e.g., its direction). Furthermore, there was no suggestion that following the ejection of each vortical puff, a momentary air stream of "make up" air of equal mass is drawn back into the chamber and that, as a result, the jet is effectively synthesized from the air outside of the chamber and the net mass flux out of the chamber is zero. There was also no suggestion that such an apparatus could be used in such a way as to create a fluid flow within a bounded (or sealed) volume.

Such uses and combinations were not only not suggested at that time, but also have not been suggested by any of the ensuing work in the art. So, even though a crude synthetic jet was known to exist, applications to common problems associated with other fluid flows or with lack of fluid flow in bounded volumes were not even imagined, much less suggested. Evidence of this is the persistence of certain problems in various fields which have yet to be solved effectively.

Vectoring of a Fluid Flow

Until now, the direction of a fluid jet has chiefly been controlled by mechanical apparatus which protrude into a jet flow and deflect it in a desired direction. For example, aircraft engines often use mechanical protrusions disposed in jet exhaust in order to vector the fluid flow out of the exhaust nozzle. These mechanical protrusions used to vector flow usually require complex and powerful actuators to move them. Such machinery often exceeds space constraints and often has a prohibitively high weight. Furthermore, in cases like that of jet exhaust, the mechanism protruding into the flow must withstand very high temperatures. In addition, large power inputs are generally required in order to intrude into the flow and change its direction. For all these reasons, it would be more desirable to vector the flow with little or no direct intrusion into the flow. As a result, several less intrusive means have been developed.

Jet vectoring can be achieved without active actuation using the coanda effect, or the attachment of a jet to a curved (solid) surface which is an extension one of the nozzle walls (Newman, B. G. "The Deflexion of Plane Jets by Adjacent Boundaries-Coanda Effect," *Boundary Layer and Flow Control* v. 1, 1961 edited by Lachmann, G. V. pp. 232–265.). However, for a given jet momentum, the effect is apparently limited by the characteristic radius of the curved surface. The effectiveness of a coanda surface can be enhanced using a counter current flow between an external coanda surface and a primary jet. Such a system has been used to effect thrust vectoring in low-speed and high-speed jets by Strykowski et al. (Strykowski, P. J, Krothapalli, A., and Forliti D. J. "Counterflow Thrust Vectoring of Supersonic Jets," AIAA Paper No. 96-0115, AIAA 34th Aerospace Sciences Meeting, Reno, Nev., 1996.).

The performance of coanda-like surfaces for deflection of jets can be further improved by exploiting inherent instabilities at the edges of the jet flow when it is separated from the surface. It has been known for a number of years that substantial modification of shear flows can result from the introduction of small perturbations at the boundaries of the shear flow. This modification occurs because the shear flow is typically hydrodynamically unstable to these perturbations. Such instability is what leads to the perturbations' rapid amplification and resultant relatively large effect on the flow. This approach has been used in attempts to control separating flows near solid surfaces. The flow typically separates in the form of a free shear layer and it has been shown that the application of relatively small disturbances near the point of separation can lead to enhanced entrainment of ambient fluid into the layer. Because a solid surface substantially restricts entrainment of ambient fluid, the separated flow moves closer to the surface and ultimately can reattach to the surface. This effect has been used as a means of vectoring jets near solid surfaces. See e.g., Koch (Koch, C. R. "Closed Loop Control of a Round Jet/Diffuser in Transitory Stall," PhD. Thesis, Stanford University, 1990) (using wall jets along in a circular diffuser to effect partial attachment and thus vectoring of a primary round jet).

Similar to mechanical deflectors, technologies that rely on coanda surfaces are limited because of the size and weight of the additional hardware. Clearly, a coanda collar in aerospace applications must be carried along at all times whether or not it is being used.

Fluidic technology based on jet-jet interaction has also been used for flow vectoring or producing oscillations of free jets. Fluidic actuators employing control jets to affect a primary jet of the same fluid within an enclosure that allows for inflow and outflow have been studied since the late 1950's. These actuators perform a variety of "analog" (e.g., proportional fluidic amplifier) and "digital" (e.g., flip-flop) throttling and control functions in flow systems without moving mechanical parts (Joyce, 1983). In the "analog" actuator, the volume flow rate fraction of two opposite control jets leads to a proportional change in the volume flow rate of the primary stream out of two corresponding output ports. The "digital" actuator is a bistable flow device in which the control jets and Coanda effect are used to direct the primary stream into one of two output ports.

These approaches have also been employed in free jets. Viets (1975) induced spontaneous oscillations in a free rectangular jet by exploiting the concept of a "flipflop" actuator. More recently, Raman and Cornelius (1995) used two such jets to impose time harmonic oscillations in a larger jet by direct impingement. The control jets were placed on opposite sides of the primary jet and could be operated in phase or out of phase with each other.

Use of a fluidic jet to vector another flow, while known for years, has been used with limited success. In particular, the only way known to vector a jet with another jet (dubbed a "control jet") of the same fluid was to align the control jet so that it impinges directly on the primary jet. Obviously, this involved injection of mass into the flow and has not been deemed very effective at vectoring the primary flow because it relies on direct momentum transfer between the jets for altering the direction of the primary jet. Direct momentum transfer is not economical in general and undesirable when the available power is limited (such as on board an aircraft). Furthermore, such control hardware is difficult and expensive to install because of the complex plumbing necessary to supply the control jet with fluid to operate.

Modification of Fluid Flows about Aerodynamic Surfaces

The capability to alter the aerodynamic performance of a given airframe by altering its shape (e.g., the "camber" of an airfoil) during various phases of the flight can lead to significant extension of the airframe's operating envelope. Geometric modification of lifting surfaces has so far been accomplished by using mechanical fla0s and slats. However, because of the complex control system required, such devices are expensive to manufacture, install and maintain. Furthermore, flap systems not only increase the weight of the airframe, but also require considerable interior storage space that could be used for cargo, and additional ancillary hardware (e.g., hydraulic pumps, piping, etc.). In some applications, the weight penalty imposed by the flaps may more than offset their usefulness.

In addition to the use of mechanical flaps, there has been considerable effort to enhance the aerodynamic performance of lifting surfaces by delaying flow separation and thus the loss of lift and increase in drag. Conventional methods for such flow control have primarily focused on delay of separation or inducement of reattachment by introducing small disturbances into the upstream wall boundary layer. Excitation methods have included external and internal acoustic excitation (Huang, Maestrello & Bryant, *Expt. Fl.* 15 1987), vibrating flaps (e.g., Neuberger & Wygnanski, *USAF A TR*-88 1987) and unsteady bleeding or blowing (e.g., Sigurdson & Roshko, *AIAA* 1985, and Seifert, Bachar, Koss, Shepshelovich & Wygnanski, *AIAA J.* 31 1993). These methods have been used with varying degrees of success. The effectiveness largely depends on the receptivity of the boundary layer to excitation within a relatively narrow bandwidth.

Other efforts of designers to modify the flow about an aerodynamic surface have centered on injection of energy into the boundary layer of the flow in order to augment lift, reduce drag, delay turbulent onset, and/or delay flow separation. For example, the method disclosed by U.S. Pat. No. 4,802,642 to Mangiarotty involves the retardation of a flow's transition to turbulence. However, this prior art does not and cannot change the effective aerodynamic shape of the airfoil. That is, the apparatus cannot change the direction of flow of the freestream fluid about the surface. Instead, the apparatus propagates acoustic excitation above the Tollmien-Schlichting frequency in an attempt to disrupt Tollmien-Schlichting waves as they begin to form and thereby delay the onset of turbulence. Although this method changes the drag characteristic of a lifting surface, the mean velocity field and thus apparent aerodynamic shape of the surface remain unchanged.

Such devices as slots and fluid jets have also been extensively employed to inject energy into the boundary layer in order to prevent flow separation. Recently, efforts have turned to the use of piezoelectric or other actuators to energize the boundary layer along an aerodynamic surface. See, e.g., U.S. Pat. No. 4,363,991 to Edleman. These techniques, which employ acoustic excitation, change the surface aerodynamic performance by suppressing the naturally occurring boundary layer separation. This method requires the flow state to be vulnerable to specific disturbance frequencies. Although effective at delaying flow separation, none of these devices alter the apparent aerodynamic shape or mean velocity field of a given aerodynamic surface. Even though the changes in lift and drag that are caused by separation can be somewhat restored, there is no effect before separation occurs and the locus of the stagnation points remain largely unchanged. Therefore, before the present invention, there was no way to alter the effective shape of an aerodynamic surface without the complexity, high expense, and weight penalty of mechanical flaps or slats.

Mixing of Fluids at the Small Scale Level

In a somewhat different field of study, the ability to effectively control the evolution of the shear layer between two streams of similar fluids (gas or liquid) may have great impact on the mixing between the two streams (e.g., mixing a hot exhaust plume with cold ambient air). The boundary between the two streams forms the turbulent flow region known as a "shear layer." Hydrodynamic instabilities in this shear layer induce a hierarchy of vortical structures. Mixing between the two streams begins with the entrainment of irrotational fluid from each stream by the large-scale vortical structures. These vortical structures scale with geometric features of the flow boundary (e.g., nozzle diameter of a jet, vortex generators, etc.) and they are critical to the mixing process between the two streams by bringing together in close contact volumes of fluid from each stream in a process that is referred to as entrainment. Layers of entrained fluid are continuously stretched and folded at decreasing scales by vortical structures that evolve through the action of shear and localized instabilities induced by larger vortical structures. This process continues until the smallest vortical scales are attained and fluid viscosity balances the inertial forces. This smallest vortical scale is referred to as the Kolmogorov scale. Thus, a long-held notion in turbulence is that the smallest and largest turbulent motions are indirectly coupled through a cascade of energy from the largest to successively smaller scales until the Kolmogorov scale is reached and viscous diffusion can occur. Turbulent dissipation is the process by which (near the Kolmogorov scale) turbulent kinetic energy is converted into heat as small fluid particles are deformed.

Scalar mixing (of heat or species, for example) is similar, but not identical to momentum mixing. Analogous to the Kolmogorov scale, the Batchelor scale is the smallest spatial scale at which an isoscalar particle can exist before scalar gradients are smoothed by the action of molecular diffusion. If scalar diffusion occurs on a faster scale than momentum diffusion, the Kolmogorov energy cascade breaks "packets" of scalars down into scales small enough that molecular scalar diffusion can occur (at the Batchelor scale). In this case, the Batchelor scale is larger than the Kolmogorov scale and turbulent motions persist at scales where scalar gradients have been smoothed out by diffusion. If, on the other hand, scalar diffusion occurs on a slower scale than momentum diffusion, turbulent motions stop (at the Kolmogorov scale) before the scalar gradients are smoothed out. Final mixing only occurs after laminar straining further reduces the size of the scalar layers.

There is a substantial body of literature that demonstrates that mixing in shear flows can be influenced by manipulating the evolution of the large scale eddies (vortical structures) within the flow. Because the large-scale eddies result from inherent hydrodynamic instabilities of the flow, they can be manipulated using either passive or active devices.

As noted above, although the entrainment process in turbulent shear flows is effected by the large-scale eddies, molecular mixing ultimately takes place at the smallest scales which is induced by a hierarchy of eddies of decreasing scales that continuously evolve from the largest scale eddies. Because the base flows are normally unstable at the large scales (and thus receptive to either passive or active control inputs), the traditional approach to controlling mixing at the small-scale has been indirect. Previous attempts to control small-scale mixing employing both passive and active control strategies have relied on manipulation of global two-and three-dimensional instability modes of the base flow with the objective of controlling mixing through the modification of the ensuing vortical structures.

Passive control has primarily relied on (permanent) modification of the geometry of the flow boundary. For example, mixing of jet exhaust is often enhanced by corrugating the exhaust port of a jet. This corrugation creates the appearance of a number of lobes defined by raised and recessed curves which induce counter-rotating vortices, thus promoting mixing in the direction of the exhaust flow. Other passive devices for the promotion of mixing have included small tabs that act as vortex generators. The disadvantage of such mixing devices is that their geometry is fixed and thus their effectiveness cannot be adjusted for varying flow conditions.

Conventional active control strategies overcome this deficiency because the control input can be adjusted. For example, one prior disclosure describes the manipulation of large scale eddies in a plane shear layer between two uniform streams using a small oscillating flap. However, because this approach depends on the classical cascading mechanism to transfer control influence to the scales at which molecular mixing occurs, mixing at the smallest scales in fully turbulent flows is only weakly coupled 4o the control input. More importantly, mixing control of this nature relies on a priori knowledge of the flow instabilities and associated eigenfrequencies of the particular flow. Specifically, this method also requires that the flow be unstable to a range of disturbances, a condition which is not always satisfied.

Clearly, more efficient control of mixing in fully turbulent shear flows might be achieved by direct (rather than hierarchical) control of both the large-scale entrainment and the small-scale mixing processes. Such a control method has, before now, not been available but is enabled by synthetic jet actuators that are the subject of the present disclosure.

Some common applications of mixing in a bounded volume are mixing in chemical lasers and mixing for chemical or pharmaceutical products. In addition to these fields, the development of methods for enhancement of mixing through manipulation of the flow in which it occurs will have a direct impact on the performance of various other technologically important systems (e.g., in bioengineering).

Cooling of Heated Bodies

Cooling of heat-producing bodies is a concern in many different technologies. Particularly, a major challenge in the design and packaging of state-of-the-art integrated circuits in single- and multi-chip modules (MCMs) is the ever increasing demand for high power density heat dissipation. While current technologies that rely on global forced air cooling can dissipate about 4 W/cm$^2$, the projected industrial cooling requirements are 10 to 40 W/cm$^2$ and higher within the next five to ten years. Furthermore, current cooling technologies for applications involving high heat flux densities are often complicated, bulky and costly.

Traditionally, this need has been met by using forced convective cooling using fans which provide global overall cooling when what is often required is pinpoint cooling of a particular component or set of components. Furthermore, magnetic-motor-based fans have the problem of generating electromagnetic interference which can introduce noise into the system.

In applications when there is a heat-producing body in a bounded volume, the problem of cooling the body is substantial. In fact, effective cooling of heated bodies in closed volumes has also been a long standing problem for many designers. Generally, cooling by natural convection is the only method available since forced convection would require some net mass injection into the system, and subsequent collection of this mass. The only means of assistance would be some mechanical fan wholly internal to the volume. However, often this requires large moving parts in order to have any success in cooling the heated body. These large moving parts naturally require high power inputs. But, simply allowing natural convective cooling to carry heat from the body producing it into 4he fluid of the volume and then depending on the housing walls to absorb the heat and emit it outside the volume is a poor means of cooling.

SUMMARY OF THE INVENTION

Briefly described, the present invention involves synthetic jet actuators designed to exploit the inherent advantages of micromachining technology. Various novel applications of micromachined synthetic jet actuators, or microjets, are also included in the present invention.

A first object of the present invention is to provide an improved device for asserting indirect, non-intrusive control over a fluid flow. Most of the previous approaches to flow control can be classified as direct contact actuators. That is, prior art actuators generally have mechanical moving parts that come into direct contact with the flow in order to effect control authority. In contrast to these approaches, the fluidic technology based on synthetic jet actuators, which is the subject of the present invention, allows indirect assertion of control authority.

Another object of the present invention is for producing a synthetic jet stream of fluid synthesized from the working fluid of the medium where the synthetic jet actuator is deployed. Thus, linear momentum is transferred to the flow system without net mass injection into the system.

Another object of the present invention is to provide a synthetic jet actuator producing a fluidic jet stream for actively controlling fluid flows while eliminating the need for any complex piping or plumbing to supply fluid to the jet actuator.

Another object of the present invention is to provide a jet actuator which responds very quickly to control inputs and is able to operate effectively at high frequencies.

Another object of the present invention is for the production of synthetic jet actuators to control fluid flow fields with micromachining techniques in order to capitalize on the inherent advantages to micromachining manufacturing techniques.

Another object of the present invention is for the use of micromachined zero net mass flux synthetic jet actuators to create fluid flow in a bounded, or even sealed, volume for various cooling and/or mixing applications.

I. Construction and Operation of Synthetic Jet Actuators

The construction and operation of a basic, macro-scale synthetic jet actuator will first be described below. This actuator serves as the basis for the present invention and will aid in understanding the physics behind the micromachined synthetic jet actuators of the present invention. Full size synthetic jet actuators are described in detail in prior-filed patent application Ser. No. 08/489,490, filed Jun. 12, 1995, which is incorporated fully herein by reference. After discussing full-scale synthetic jet actuators, micromachined synthetic jet actuators will be briefly described and a preferred application will also be briefly discussed.

A. Basic Construction of Synthetic Jet Actuators

Although there are several possible configurations for a synthetic jet actuator, the most simple will be briefly described as an example. A basic macro-scale synthetic jet actuator preferably comprises a housing defining an internal chamber. An orifice is present in a wall of the housing. The actuator further includes a mechanism in or about the housing for periodically changing the volume within said internal chamber so that a series of fluid vortices are generated and projected in an external environment out from the orifice of the housing. The volume changing mechanism can be any suitable mechanism, for instance, a piston positioned in the jet housing to move so that fluid is moved in and out of the orifice during reciprocation of the piston. Preferably, the volume changing mechanism is implemented by using a flexible diaphragm as a wall of the housing. The flexible diaphragm may be actuated by a piezoelectric actuator or other appropriate means.

Typically, a control system is utilized to create time-harmonic motion of the diaphragm. As the diaphragm moves into the chamber, decreasing the chamber volume, fluid is ejected from the chamber through the orifice. As the fluid passes through the orifice, the flow separates at the sharp edges of the orifice and creates vortex sheets which roll up into vortices. These vortices move away from the edges of the orifice under their own self-induced velocity.

As the diaphragm moves outward with respect to the chamber, increasing the chamber volume, ambient fluid is drawn from large distances from the orifice into the chamber. Since the vortices are already removed from the edges of the orifice, they are not affected by the ambient fluid being entrained into the chamber. As the vortices travel away from the orifice, they synthesize a jet of fluid, a “synthetic jet,” through entrainment of the ambient fluid.

B. Micromachining Synthetic Jet Actuators

The present invention involves use of micromachining techniques in the development of novel synthetic jet actuators for various fluid flow control applications. Micromachining is traditionally defined as the use of microfabrication technologies to create mechanical structures, potentially in addition to electronic devices. The use of microfabrication technologies gives to actuators the same advantages which integrated circuits enjoy, namely batch fabrication, and ease of realization and interconnection of large, cooperative actuator arrays. Another advantage may be small size. However, it is not required in the present invention that small size be maintained. As such, "micromachining" synthetic jet actuators should properly be defined as the use of batch fabrication technologies in a broad sense, without limiting it to integrated circuit fabrication technologies or other very small scale actuators.

1. Basic Micromachined Actuator Design

Micromachined synthetic jet actuators, or "microjet" actuators, are preferably fabricated from a substrate defining an actuator cavity with an orifice permitting fluid communication between the cavity and an external environment. Preferably, the actuator cavity is bounded at least partially by a flexible membrane. Vibration of the membrane preferably using either an electrostatic or piezoelectric drive results in a turbulent air jet formed approximately normal to the microjet orifice. As in larger-scale geometries, the synthetic jet stream is synthesized by a train of vortex rings. Each vortex is formed by the motion of the diaphragm and is advanced away from the microjet orifice under a self-induced velocity. The vortices are formed at the excitation frequency of the membrane and the jet stream of fluid is synthesized by vortex interaction with ambient fluid downstream from the orifice. The excitation frequency may vary widely depending on the application in which the microjet is used.

Another preferred embodiment for a microjet actuator comprises simulating a "piston in cylinder" arrangement to take the functional place of the vibrating diaphragm. This can be accomplished by changing the aspect ratio of the actuator cavity to a deeper, more cylindrical shape. A piston-like actuator may then be realized by using a "bossed" diaphragm. A bossed diaphragm, for example, may comprise a diaphragm in which a thick mass is fabricated on the center and protrudes into the cylindrical actuator cavity upon actuation of the diaphragm. In addition, corrugations can be incorporated in the supporting diaphragm in order to increase flexibility of the piston support.

2. Specific Construction of Single Microjet Actuators

A first preferred embodiment for a microjet employs traditional micromachining technologies to realize these microjets. Initially, a high resistivity silicon wafer is preferably employed as a substrate for the device. Next, a layer of silicon dioxide is preferably deposited on both a top and a bottom side of the silicon wafer. Wet thermal oxidation is the preferred method of applying the layer of silicon dioxide. A layer of aluminum is then deposited on the top side of said wafer and an orifice hole is patterned in the aluminum layer.

A matching orifice hole is also created on the bottom side of the wafer using a photolithography process. Next, a jet orifice is anisotropically etched on the top side of said wafer and an actuator hole is formed in the bottom side of the wafer. The actuator hole is formed by a photolithography process.

An actuator cavity is formed in the wafer by anisotropically etching the actuator hole to an increased depth. The wafer is then preferably re-oxidized using thermal oxidation such that a layer of silicon dioxide is formed in the actuator cavity. A layer of aluminum is then sputtered on the bottom side of the silicon wafer to act as a first electrode for an electrostatic actuation method.

A flexible membrane, preferably a layer of polyimide film, is then appropriately bonded to the bottom side of the wafer to form a flexible actuation diaphragm and this film is then coated with a layer of aluminum using DC sputtering. This last layer of aluminum comprises a second electrode for the electrostatic actuation of the polymide film membrane. When the film is actuated, the device functions as a synthetic jet actuator of very small scale. This device may also include a power source for actuation and a control system, such as a microcomputer.

An improvement to microjets is the use of modulators with the jet actuators. Modulators are generally devices to selectively control flow through the orifice of a synthetic jet actuator (such as by covering and uncovering the orifice) in order to prevent either flow into or out of the jet cavity. In essence, a modulator controls the functioning of the synthetic jet actuator.

Modulators usually are constructed in two forms: vertical drive and lateral drive modulators. Vertical drive modulators move in the direction of the jet flow in order to seal the orifice hole. The modulators typically are designed as a "flap" attached to the substrate inside the actuator cavity by a hinge-like mechanism. An electrical impulse controls the modulator motion to cover and uncover the orifice. Lateral drive modulators, on the other hand, can be thought of as "shutters" which slide to partially or totally occlude the jet orifice hole. If required, standard overpressure stops may be used with either type of modulator to prevent damage to the modulators. A third type of modulator can be formed as an "inflatable collar" about the microjet orifice. When the collar is inflated, flow through the orifice is restricted, or even stopped. Of course, all of the above-described modulators may be formed using micromachining technologies. That is, the modulators may be batch fabricated along with the rest of the microjet. In this way, modulator control circuitry can also be fabricated.

3. Amplification of Microjets

Many applications of synthetic jet actuators may require an unusually small apparatus. While conventional jet actuators may not be practical on such a small scale, because synthetic jet actuators can draw so much of their power from another flow, and are so simple in design, they are ideal for a micro-scale embodiment. Even though small in size, if used near another free flow, a synthetic jet actuator will draw power from the other flow through entrainment of the other flow. On the other hand, if the synthetic jet actuator is in a bounded volume, several synthetic jet actuators may be arrayed to build upon one another into a type of "cascaded" control.

While there is no question that one of the most important application areas for microactuators is the control of macro-events, as noted above, these actuators usually generate insufficient force to directly realize control authority. Thus, some type of amplification is often required. An attractive means for the amplification of the actuator output is its coupling to inherently unstable pressure or flow systems. If system operating points are carefully chosen, the relatively small forces generated by a microactuator can be used to create large disturbances in either static, pressure-balanced systems or in free and wall-bounded shear flows. For example, in the area of jet thrust vectoring, millimeter-scale actuators can be used for thrust vectoring of larger jets having characteristic length scales that are at least two orders of magnitude larger. The energy necessary for manipulation is extracted from the vectored flow and thus the power input to the actuator is of the order of several milliwatts. Use of millimeter-scale microjets to control larger jets suggests the concept of cascaded control. Namely, that microjet actuators be used to manipulate millimeter-scale jets which, in turn, will control larger jets.

4. Arrays of Microjets

Some applications of flow control may best be suited for whole arrays of microjet actuators. Arrays of microjet actuators are particularly attractive for applications such as jet vectoring because they can be individually addressed and phased. The first preferred embodiment of an addressable microjet actuator array comprises an array of small orifices situated on top of an array of actuator cavities. Both the orifices and the cavities are batch fabricated from <100> silicon using micromachining techniques. Alternatively, silicon may be replaced with other cheaper or more robust substrates.

In this first preferred embodiment, individual jet control can be achieved by use of a metallized flexible polyimide diaphragm. The metal electrodes on the diaphragm are patterned so that voltage can be individually applied to the region over each actuator cavity. A key feature of this design is that the diaphragm can be vibrated using either a commercial piezoelectric transducer to drive all array elements in parallel or a sinusoidal drive voltage applied to the flexible diaphragm of individual array elements. Driving the membrane in either fashion results in cavity pressure variations and a jet flow through the orifices. An individual jet is modulated by either reducing the amplitude of the drive voltage of an individual array element (for electrostatic drive) or by electrostatically modulating the diaphragm vibration amplitude for that element (for piezoelectric drive).

A second preferred embodiment for a microjet array comprises a housing defining a cavity. The volume of the cavity is altered by a volume changing means. Preferably, the volume changing means comprises a piezoelectrically driven membrane or a piston element. However, the volume changing means may comprise an electromechanical or magnetically driven flexible membrane, as well as a combustion force.

The housing of the second preferred embodiment comprises multiple orifices in a wall of the housing. These orifices preferably have individually controllable louvers or modulators adjacent to the orifices. In that way, flow through the orifices may be controlled individually by the louvers or modulators.

The volume changing means preferably periodically changes the volume of the cavity. As the volume is increased, fluid is drawn through the orifices and into the volume. As the volume is subsequently decreased, the fluid is forced out through the orifices that are open (i.e. not obstructed by modulators or louvers), forming vortex sheets at the orifices, which roll up into vortices. These vortices move away from the orifices and entrain an ambient fluid into a synthetic jet stream. As such, the second preferred embodiment produces an array of synthetic jet streams.

II. Features of and Applications for Micromachined Synthetic Jet Actuators

Generally, "microjets" can accomplish the same tasks, in the same applications as conventional, larger, synthetic jet actuators. Synthetic jet actuators, whether conventional actuators or microjets, may be used to create fluid flow in a bounded, or sealed, volume. Synthetic jet actuators are also excellent for vectoring other fluid flows without mechanically intruding into the flow. Furthermore, synthetic jet actuators will enhance mixing of fluids through direct control of small scale mixing and will enhance cooling of various heat-producing bodies. All these applications are described in the parent application Ser. No. 08/489,490. The inherent characteristics of synthetic jets may be exploited by using microjets in several preferred applications.

A first preferred application for microjets is in the modification of a fluid flow about a body or surface. When a microjet or microjet array is embedded in a body in a fluid flow field, the actuators can alter the apparent aerodynamic shape of the body with respect to the flow field. For such an application, one or more microjets are preferably embedded in a solid body, or surface, with microjet orifices built into the body/surface. The interaction of the fluid flow about the body with a synthetic jet stream produced by the actuators will change the overall fluid flow field around the solid body.

In contrast to the prior art, a unique feature of microjet actuators is that they can effectively modify wall-bounded shear flows by creating closed recirculating flow regimes near solid surfaces. In fact, the synthetic jet stream actually penetrates the flow boundary layer to affect the overall flow field about the solid body. This clearly distinguishes the present invention from prior art attempts to merely energize the boundary layer. Additionally, closed flow regimes can be formed by microjet actuators when the actuators are placed in an embedding flow, because the jet actuators do not dispense new fluid into the flow. Thus, when microjet actuators are placed near solid surfaces in wall bounded flow, they result in a change in the apparent aerodynamic shape of the surface; hence they can be exploited for modification of aerodynamic performance measures such as lift or drag.

The first preferred application for the present invention is use of one or more microjet actuators to modify the aerodynamic shape of a lifting surface in a flow field. Such a lifting surface will typically comprise a wing or rotor blade. However, any other aerodynamic surface may benefit from the present preferred embodiment. A microjet actuator, or several actuators, embedded in a solid lifting surface creates a permanent recirculation region near each jet orifice. Such a recirculation region modifies both the flow field and pressure distribution around the aerodynamic surface thereby modifying both lift and drag characteristics of the surface. Preferably, an entire array of individually addressable microjets are distributed across the surface of the wing—either an upper or lower surface.

In particular, because the aerodynamic characteristics of an airfoil depend critically on the location of its front and rear stagnation points and on its camber and thickness, these characteristics can be altered by microjet actuators without the use of movable flaps. Placement of microjet arrays and the creation of closed recirculating flow regions along the leading and trailing edges and along the upper and lower surfaces of an airfoil can result in displacement of the airfoil's front and rear stagnation points and change its apparent thickness and camber. Addressable microjet arrays can also be used to dynamically tailor and optimize aerodynamic performance preventing premature flow separation and thus loss of lift.

This application of the present invention will improve the efficiency of aircraft at various flight regimes. Typically, an aircraft wing is designed for optimum performance at a primary mission flight regime. As a consequence, the efficiency of the aircraft suffers in other regimes. However, with the present invention, microjet arrays can be tailored to alter the aerodynamic shape of the wing during inefficient flight regimes in order to dramatically improve overall aircraft efficiency.

It is important that microjet actuators are synthesized from the working fluid of the flow system in which they are employed. This feature obviates the need for expensive and bulky input piping and complex fluidic packaging. These attributes of zero net mass flux microjet actuators also make them ideally suited for low-cost batch fabrication. This is in stark contrast to the prior art usage of flaps or slats to change the flow about an aerodynamic surface.

Other applications for microjets will be obvious to one with skill in the art. For example, cooling electronic components with microjets is an important use of microjet actuators. Cooling applications are described in detail for conventional synthetic jet actuators in a concurrently filed Application entitled "Synthetic Jet Actuators for Cooling Heated Bodies and Environments" (filed on Nov. 13, 1997, with Ser. No. 08/970,607, now U.S. Pat. No. 6,123,145, which is incorporated herein by reference. Microjets, or microjet arrays, will also cool other heated bodies effectively. Such applications are intended to be included in the present invention.

An advantage to the present invention is that the synthetic jet actuators described above eliminate the need for complex piping or plumbing to carry fluid to the microjet actuator for any application in which it is used.

Another advantage to the present invention is that the zero net mass flux microjet actuator will be much easier to manufacture and be much more readily installed in places where space constraints are critical than other jet actuators.

Another advantage to the use of synthetic control jets for vectoring a fluid flow is that the two jets can be used in parallel. This simplifies the installation and maintenance of the primary jet and the synthetic control microjet.

Another advantage to the use of a microjet actuator to vector another primary jet is that microjet actuators vector economically. Because the energy necessary for the manipulation of the primary jet is extracted from the mean flow of the primary jet, the power input to the synthetic control jet can be quite small.

An additional advantage is that the controller bandwidth may be very high due to the fact that the primary flow responds at the frequency of the diaphragm of the microjet actuator. This driving frequency can vary from several hundred hertz to several kilohertz.

An additional advantage to the preferred embodiments of the present invention becomes obvious when a microjet actuator is used to control another microjet actuator. In this way, the direction of the synthetic jet pair, or array, can be dynamically and accurately controlled by merely modifying the phase angle of the two volume changing means in the jet actuator pair or by controlling the amplitude and phase of modulators fixed about the actuator orifices in an appropriate fashion. Complex and disruptive mechanical flow modifiers, which are necessary to modify the direction in the prior art, are not necessary to the present invention.

An additional advantage to microfabricated synthetic jet actuators is that microactuators typically consume small amounts of power, and they can be integrated onto a chip with microsensors and control electronics.

Another advantage of the present invention is that microjets may be realized by high density batch fabrication for lower cost and improved reliability.

Other features and advantages will become apparent to one with skill in the art upon examination of the following drawings and detailed description. All such additional features and advantages are intended to be included herein within the scope of the present invention, as is defined by the claims.

BRIEF DESCRIPTION OF THE DRAWINGS

The present invention can be better understood with reference to the following drawings. The drawings are not necessarily to scale, emphasis instead being placed upon clearly illustrating principles of the present invention. Moreover, like reference numerals designate corresponding parts throughout the several views.

DETAILED DESCRIPTION OF THE PREFERRED EMBODIMENTS

It will be obvious to those skilled in the art that many modifications and variations may be made to the preferred embodiments of the present invention as described hereafter without substantially departing from the spirit and scope of the present invention. All such modifications and variations are intended to be included herein within the scope of the present invention, as is set forth in the appended claims.

First, conventional, macro-scale, synthetic jet actuators are described below. This description explains the basic operating principles of synthetic jet actuator technology and will aid understanding the construction and potential applications for synthetic jet actuators using "batch fabrication" technologies to form "microjets." After microjet actuator construction is described, a representative application of micromachined synthetic jet actuators—use in aerodynamic applications—will be described in detail.

I. Basic Construction of Synthetic Jet Actuators

Figure 1A:
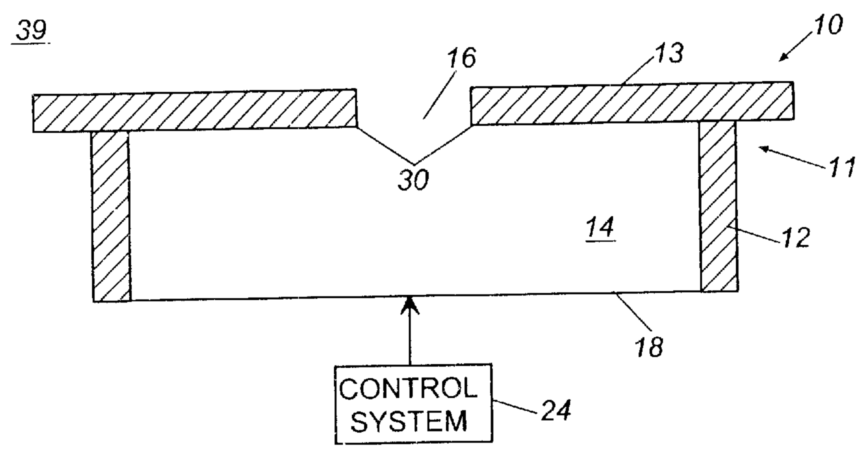
FIG. 1A is a schematic cross-sectional side view of a zero net mass flux synthetic jet actuator with a control system.

FIG. 1A depicts a basic example of a synthetic jet actuator 10 comprising a housing 11 defining and enclosing an internal chamber 14. The housing 11 and chamber 14 can take virtually any geometric configuration, but for purposes of discussion and understanding, the housing 11 is shown in cross-section in FIG. 1A to have a rigid side wall 12, a rigid front wall 13, and a rear diaphragm 18 that is flexible to an extent to permit movement of the diaphragm 18 inwardly and outwardly relative to the chamber 14. The front wall 13 has an orifice 16 of any geometric shape. The orifice diametrically opposes the rear diaphragm 18 and connects the internal chamber 14 to an external environment having ambient fluid 39.

The flexible diaphragm 18 may be controlled to move by any suitable control system 24. For example, the diaphragm 18 may be equipped with a metal layer, and a metal electrode may be disposed adjacent to but spaced from the metal layer so that the diaphragm 18 can be moved via an electrical bias imposed between the electrode and the metal layer. Moreover, the generation of the electrical bias can be controlled by any suitable device, for example but not limited to, a computer, logic processor, or signal generator. The control system 24 can cause the diaphragm 18 to move periodically, or modulate in time-harmonic motion, and force fluid in and out of the orifice 16.

Alternatively, a piezoelectric actuator could be attached to the diaphragm 18. The control system would, in that case, cause the piezoelectric actuator to vibrate and thereby move the diaphragm 18 in time-harmonic motion. The method of causing the diaphragm 18 to modulate is not limited by the present invention.

Figure 1B:
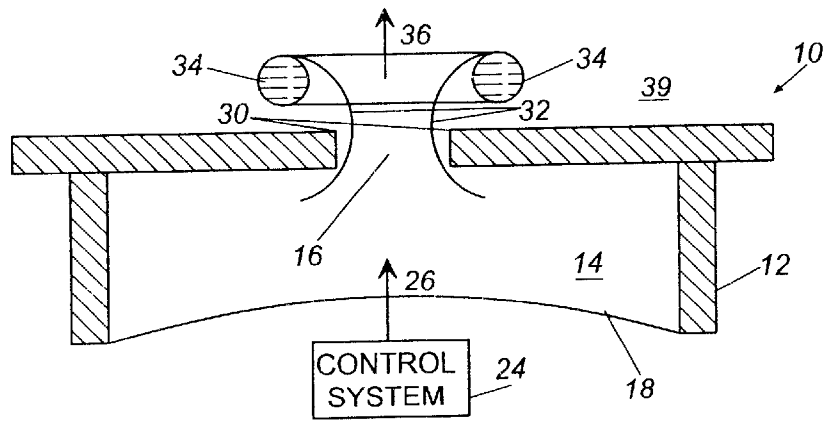
FIG. 1B is a schematic cross-sectional side view of the synthetic jet actuator of FIG. 1A depicting the jet as the control system causes the diaphragm to travel inward, toward the orifice.

The operation of the synthetic jet actuator 10 will now be described with reference to FIGS. 1B and 1C. FIG. 1B depicts the synthetic jet actuator 10 as the diaphragm 18 is controlled to move inward into the chamber 14, as depicted by arrow 26. The chamber 14 has its volume decreased and fluid is ejected through the orifice 16. As the fluid exits the chamber 14 through the orifice 16, the flow separates at sharp orifice edges 30 and creates vortex sheets 32 which roll into vortices 34 and begin to move away from the orifice edges 30 in the direction indicated by arrow 36.

Figure 1C:
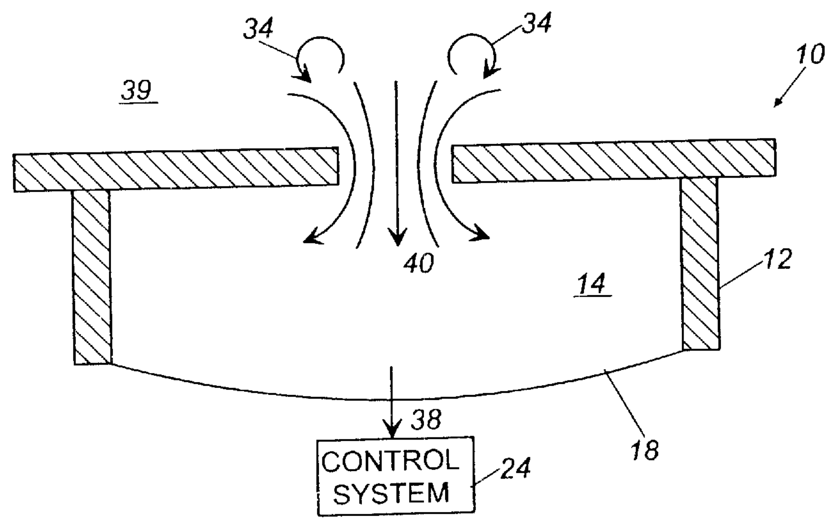
FIG. 1C is a schematic cross-sectional side view of the synthetic jet actuator of FIG. 1A depicting the jet as the control system causes the diaphragm to travel outward, away from the orifice.

FIG. 1C depicts the synthetic jet actuator 10 as the diaphragm 18 is controlled to move outward with respect to the chamber 14, as depicted by arrow 38. The chamber 14 has its volume increased and ambient fluid 39 rushes into the chamber 14 as depicted by the set of arrows 40. The diaphragm 18 is controlled by the control system 24 so that when the diaphragm 18 moves away from the chamber 14, the vortices 34 are already removed from the orifice edges 30 and thus are not affected by the ambient fluid 39 being drawn into the chamber 14. Meanwhile, a jet of ambient fluid 39 is synthesized by the vortices 34 creating strong entrainment of ambient fluid drawn from large distances away from the orifice 16.

II. Micromachined "Batch Fabricated" Synthetic Jet Actuators

Many applications of synthetic jet actuators may require that the synthetic jet actuator used be of very small size. To accommodate this requirement, a synthetic jet actuator can be micromachined to form what may be called a "microjet"

actuator. Microjet actuators can be used in macro flow control and other applications involving interaction of a microjet with another fluid flow as well as situations requiring fluid flow in a bounded volume.

A. First Preferred Embodiment for Microjet Actuators and Arrays

Figure 3:
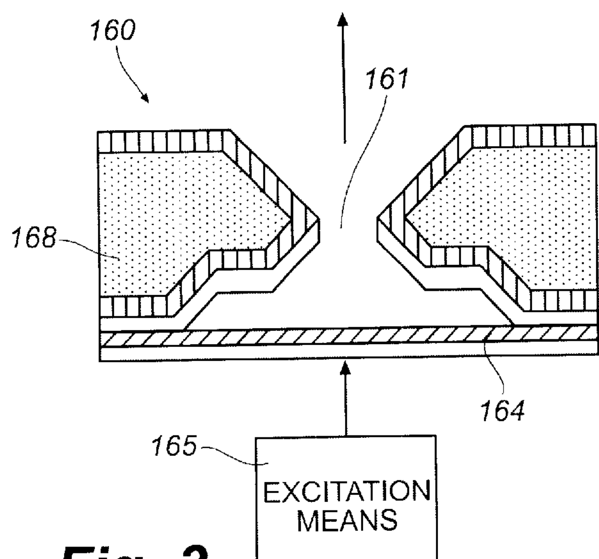
FIG. 3 is a schematic cross-sectional side view of a microjet actuator fabricated with a novel micromachining process of the present invention.

FIG. 3 depicts a cross-section of the first preferred embodiment of a microjet actuator, denoted generally by reference numeral 160. In the preferred embodiment, the microjet actuator 160 comprises an orifice 161 situated atop a sealed chamber 162 which is bounded opposite the orifice 161 by a flexible membrane 164. Vibration of the membrane 164 by some excitation means 165 results in a turbulent fluid flow, as depicted by arrow 166, formed generally normal to the microjet orifice 161. Actuation is typically accomplished electrostatically. The fluid flow 166 from the microjet actuator 160 is produced by the same physical interactions which were described above for larger synthetic jets. Although possible to do otherwise, in the preferred embodiment of a microjet actuator 160, the orifice 161 and the membrane 164 are incorporated into the same substrate 168, preferably a silicon wafer.

Of course, use of various substrate materials other than silicon are possible and potentially preferable in certain applications. For example, metals such as titanium or aluminum are possible for use in the fabrication of microjets and provide a more robust substrate, such as to withstand more aggressive environments.

Additionally, the examples described in more detail below all describe a type of membrane to periodically change the volume of the synthetic jet actuator cavity. However, other volume changing devices are included in the present invention. For example, the aspect ratio of the cavity may be modified to a deeper, more cylindrical shape. Then a piston-like element can then be realized by using a "bossed" diaphragm bounding a portion of the actuator cavity. A bossed diaphragm, for example, may comprise a diaphragm in which a thick mass is fabricated on a center portion of the diaphragm and which can protrude into the cylindrical actuator cavity upon actuation of the diaphragm. In this way, the piston element actually changes the volume of the cavity by sliding in the cavity as a result of an electrostatic or electromagnetic actuation of the diaphragm.

Of course, micromachining techniques are well known which allow the orifice holes of the microjets to be constructed in faces of the substrate which are not directly across from the flexible diaphragm, or other volume changing device. Microjets so-constructed may be advantageous for low-profile or other applications and will also produce functional microjets. Such an obvious -odification is a part of the present invention.

1. First Preferred Construction of a Single Microjet Actuator

Figure 4A:
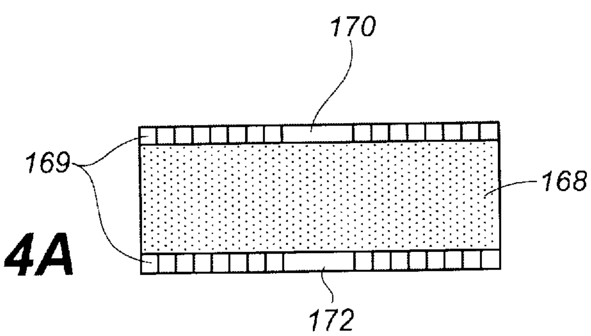
FIG. 4A is a schematic cross-sectional side view of a partially fabricated microjet actuator of FIG. 3 prior to a step in the micromachining process of etching the orifice in the silicon wafer.

FIGS. 4A through 4E depict the various steps which are taken to create the first preferred embodiment of a microjet actuator 160 (FIG. 3). The steps described herein are meant to be illustrative only and there are many possible minor variations which are encompassed by the present invention. Starting with a high resistivity two inch <100> silicon wafer 168 that is polished on both sides, a layer of silicon dioxide 169 (about 1 micron in thickness) is formed using wet thermal oxidation, as shown in FIG. 4A. On the front side of the wafer 168, a 3000 Å layer of aluminum is deposited using DC sputtering. Photolithography is then used to pattern a square orifice hole 170 in the aluminum. This hole 170 is designed to be about 265 microns on a side. Using the patterned aluminum as a mask for infrared alignment, a matching orifice hole 172 is created on the back side of the wafer 168 using a photolithography process.

Figure 4B:
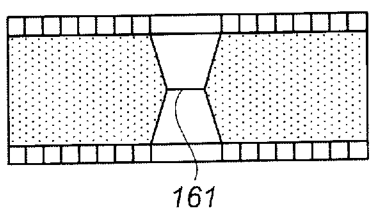
FIG. 4B is a schematic cross-sectional side view of a partially fabricated microjet actuator of FIG. 3 after a step in the micromachining process of etching the orifice in the silicon wafer.

FIG. 4B depicts the next step in the formation process. Using the patterned silicon dioxide 169 as an etch mask, the jet orifice 161 is anisotropically etched using a 20% potassium hydroxide solution in water at about 60° C.

Figure 4C:
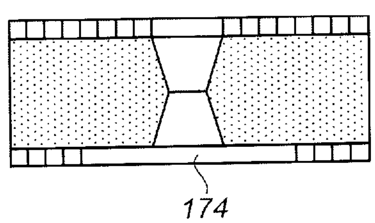
FIG. 4C is a schematic cross-sectional side view of a partially fabricated microjet actuator of FIG. 3 prior to a step in the micromachining process of etching the actuator cavity in the bottom side of the silicon wafer.

As shown in FIG. 4C, a photolithography process is then used to form a square actuator hole 174 in the back-side oxide 169. The actuator hole 174, as depicted, measures approximately 3 mm on a side.

Figure 4D:
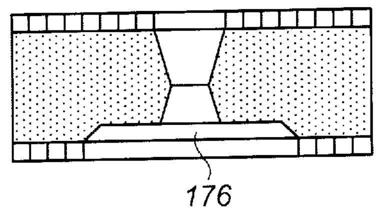
FIG. 4D is a schematic cross-sectional side view of a partially fabricated microjet actuator of FIG. 3 after a step in the micromachining process of etching the actuator cavity in the silicon wafer.

As shown in FIG. 4D, this actuator hole 174 is deepened to form the actuator cavity 172 by anisotropically etching to a depth of about 15 microns using a timed etch comprising 20% potassium hydroxide in water at about 50° C.

Figure 4E:
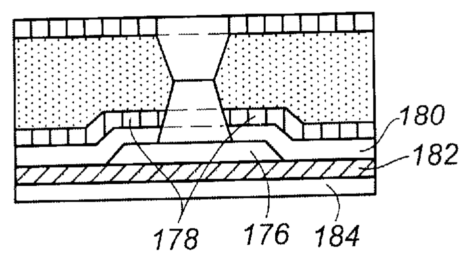
FIG. 4E is a schematic cross-sectional side view of a partially fabricated microjet actuator of FIG. 3 after steps in the micromachining process of attaching the diaphragm and metallizing the diaphragm.

The wafer 168, as shown in FIG. 4E, is then re-oxidized using thermal oxidation such that a layer of 2500 Å of silicon dioxide 178 is formed in the etched region 176 (the actuator cavity). A 3000 Å thick layer of aluminum 180 is then sputtered on the back side of the wafer 168 to act as an electrode for electrostatic actuation. A layer of polyimide film 182 is bonded to the lower side of the wafer 168 to form a flexible actuation diaphragm 182. This polyimide film 182 is then coated with a layer of about 3000 Å of aluminum 184 using DC sputtering to provide the second electrode for electrostatic actuation. Obviously, the electrostatic actuation of the diaphragm 182 creates a periodic volume change for the actuator cavity 176. This results in the formation of vortex sheets at the actuator orifice. As these vortex sheets roll into vortices, they entrain ambient fluid into a synthetic jet stream, just as described above.

2. Construction of A Microjet Actuator Array of the First Preferred Embodiment

Figure 5A:
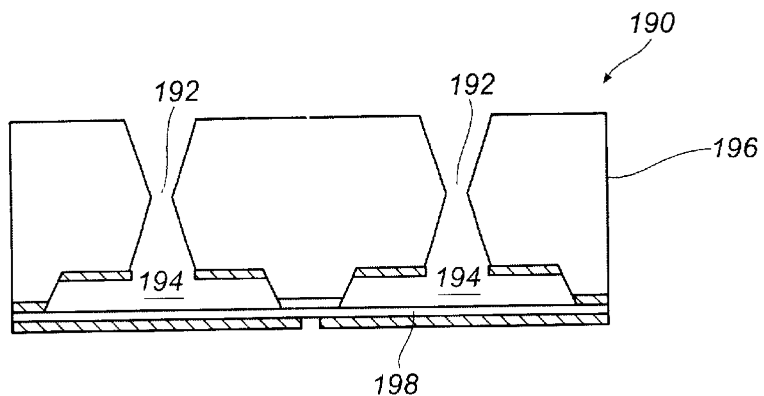
FIG. 5A is a schematic cross-sectional side view of a microjet actuator array with a hybrid microjet actuator assembly.

For many applications, an array of microjet actuators may be desired. Several approaches have been developed to create microjet arrays. A first preferred embodiment for a microjet array comprises a hybrid microjet actuator assembly (denoted generally by number 190) as illustrated in FIG. 5A. In this design 190, both an orifice 192 and a diaphragm 198 of each microjet actuator are incorporated into the same silicon wafer 196. The techniques used to manufacture such an array are similar to those just outlined for a single microjet actuator 160 (as depicted in FIG. 3). In the preferred embodiment, both of the depicted orifices 192 and the depicted cavities 194 are batch fabricated from a <100> silicon wafer 196 using standard micromachining techniques understood in the art and described in detail above. The length of an orifice 192 is defined by the thickness of the silicon wafer 196, typically about 250 microns, while the depth of the cavity 194 is approximately 15 microns. Typical orifice lateral dimensions range from 50–800 microns and typical cavity lateral dimensions range from 1 mm to 4 mm. The only difference from the fabrication technique outlined above for a single microjet is that instead of only one microjet actuator 160 per wafer 168 (as depicted in FIG. 3), a whole series of microjet actuators are fabricated in the same wafer 196 (as depicted in FIG. 5A). The array concept allows for cascaded control of the various actuators and tailoring of the substrate surface.

B. Second Preferred Embodiment for Microjet Actuators and Arrays

Figure 5B:
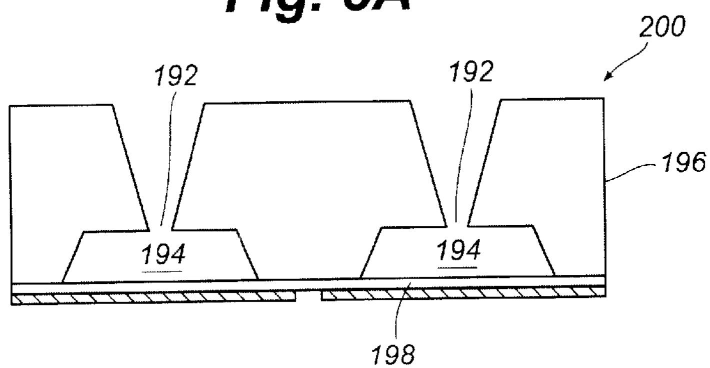
FIG. 5B is a schematic cross-sectional side view of a microjet actuator array with an integrated polyimide diaphragm produced in accordance with a novel micromachining process of the present invention.
Figure 6A:
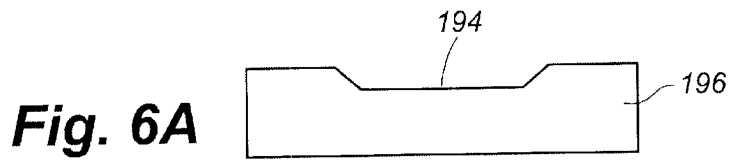
FIG. 6A is a schematic cross-sectional side view of a partially fabricated microjet actuator of FIG. 5B after a step in the micromachining process of anisotropic etching the actuator cavity.

A second preferred embodiment for microjet actuators and an individually addressable microjet actuator array 200 fabricated with an integrated polyimide membrane 198 (FIG. 5B) is as follows. Starting with a high resistivity <100> silicon wafer 196, a silicon dioxide layer is grown using wet thermal oxidation. As depicted in FIG. 6A, photolithography is then used to pattern a silicon dioxide layer on the front side to form the microjet cavity 194. Using the patterned oxide layer as an etch mask, the cavity recess 194 is then time-etched anisotropically in a potassium hydroxide solution.

Figure 6B:
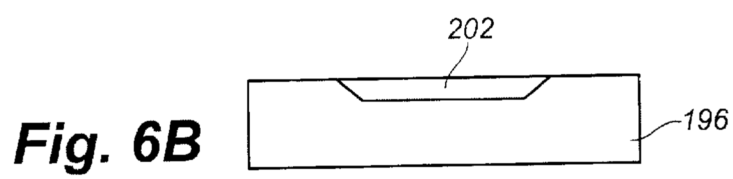
FIG. 6B is a schematic cross-sectional side view of a partially fabricated microjet actuator of FIG. 5B after a step in the micromachining process of electroplating the cavity with nickel.

An electroplating seed layer is then deposited onto the front side using thermal evaporation. Photolithography is then used to pattern a photoresist electroplating mold. As depicted in FIG. 6B, the etched recess 194 is then filled with electroplated nickel 202.

Figure 6C:
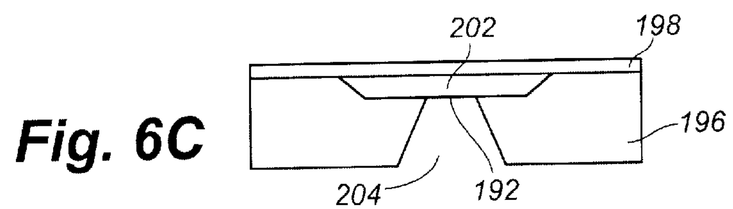
FIG. 6C is a schematic cross-sectional side view of a partially fabricated microjet actuator of FIG. 5B after steps in the micromachining process of attaching the polyimide diaphragm and of etching the orifice in the silicon wafer.

FIG. 6C depicts the next few steps. After removing the plating mold and the exposed seed layer, photolithography is used to transfer the orifice pattern to the silicon dioxide layer on the back side of the wafer 196. Infrared alignment is used to ensure that the outer orifice hole 204 is aligned with the nickel-filled cavity 202. Again, using the patterned oxide as an etch mask, the orifice 192 is anisotropically etched in a potassium hydroxide solution. The integrated polyimide membrane 198 is then formed by spin coating multiple layers of DuPont PI 2611 polyimide onto the front side of the wafer 196 over the nickel-filled cavity recesses 202.

Figure 6D:
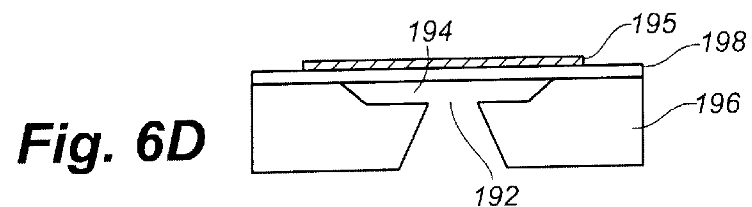
FIG. 6D is a schematic cross-sectional side view of a partially fabricated microjet actuator of FIG. 5B after the steps in the micromachining process of removing the electroplated nickel from the actuator cavity and depositing an aluminum electrode over the diaphragm.

After curing the polyimide, the seed layer and nickel 202 are removed, as shown in FIG. 6D, from the cavity 194 through the orifice hole 192 by wet etching, thus releasing the polyimide membrane 198 for actuation. Finally, the membrane electrode 195 is evaporated onto the top of the membrane 198 through a shadow mask. The silicon wafer 196 is used as the second electrode for electrostatic actuation.

Similar to the microjet actuator arrays described above, individual jet control for the second preferred embodiment is achieved by use of the metallized flexible polyimide diaphragm 198. The metal electrodes 195 on the diaphragm 198 are preferably patterned so that voltage can be individually applied to the region over each actuator cavity 194. A feature of this design is that the diaphragm 198 can be vibrated using either a commercial piezoelectric transducer to drive all array elements in parallel or a sinusoidal drive voltage applied to the flexible diaphragm 198 of individual array elements. Driving the membrane 198 in either fashion results in cavity 194 pressure variations and a jet flow through the orifice 192. An individual jet is modulated by either reducing the amplitude of the drive voltage of an individual array element for electrostatic drive or by electrostatically modulating the diaphragm 198 vibration amplitude for that element (for piezoelectric drive).

C. Third Preferred Embodiment for Microjet Actuators and Arrays

The concept of microjet actuators is unique in that micromachining techniques are employed to form small-scale synthetic jet actuators (and arrays thereof) for flow control. However, it is sometimes desirable to have synthetic jets of slightly larger scale than the devices described above can produce, but still maintain the advantages of conventional micromachining: low cost batch fabrication and integrated circuitry among other advantages. This goal can be achieved by extending the use of micromachining techniques to other substrates and other microjet components.

Figure 7A:
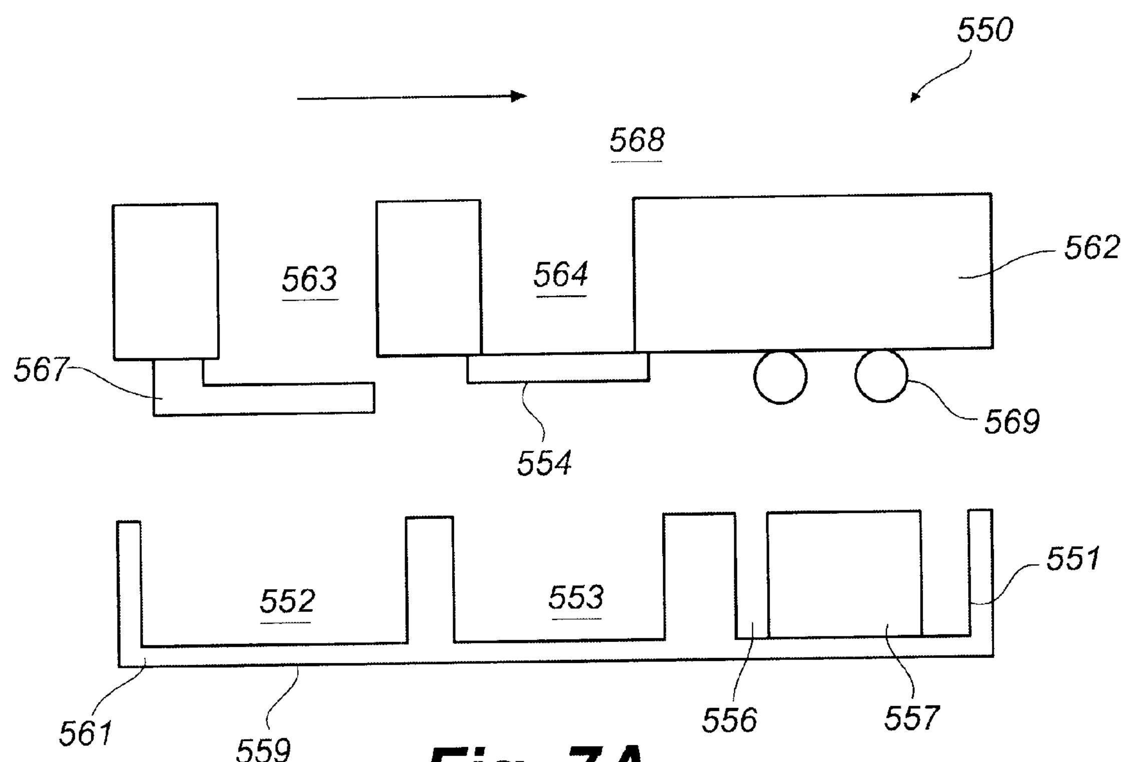
FIG. 7A is a schematic cross-sectional side view of an unassembled micromachined synthetic jet actuator module having a modulator and a pressure sensing element.
Figure 7B:
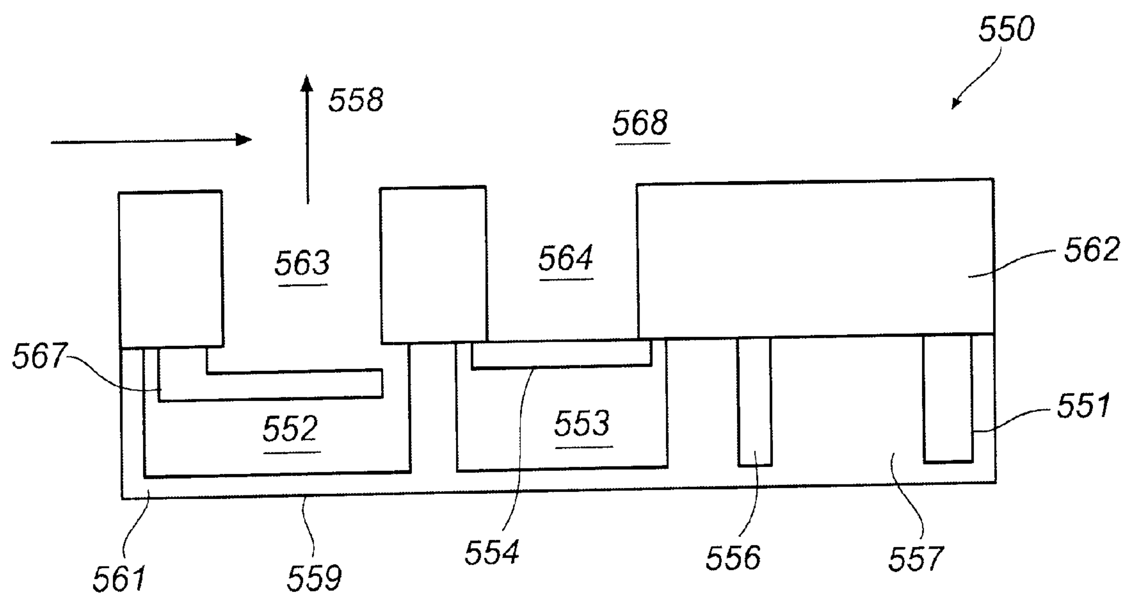
FIG. 7B is a schematic cross-sectional side view of an assembled micromachined synthetic jet actuator module having a modulator and a pressure sensing element.

FIGS. 7A and 7B depict schematic drawings of a third preferred embodiment 550 for a batch fabricated synthetic jet actuator module according to the present invention. As above, the third preferred embodiment 550 comprises a substrate 551 forming a housing defining a synthetic jet actuator cavity 552. The substrate material for the present embodiment 550 is preferably not silicon as described above. Substrate materials such as ceramics, metals, and even fiber-reinforced epoxy composites are possible and preferred in the embodiment 550 depicted in FIGS. 7A and 7B. The preferred material for the third preferred embodiment 550 is stainless steel, although other metals such as titanium or aluminum are possible. Stainless steel is selected for its resilience and mechanical robustness. This preferred substrate material is able to survive extended interaction with high speed aerodynamic flows and other harsh characteristics of generally "aggressive" environments.

The synthetic jet actuator cavity 552 of the third preferred embodiment is predrilled in the substrate 551. Holes are simply drilled in the substrate 551 of an appropriate size and shape for a given application. Although not required by the present invention, in the preferred embodiment 550, a second hole 553 is drilled in the substrate 551 to form a cavity 553 for a pressure sensing element 554. This cavity 553, however, is not drilled completely through the substrate 551. A third cavity 556, also not drilled through the substrate 551, is then preferably drilled to house integrated circuitry 557 for supplying power to the module 550 and for control of the synthetic jet stream 558 emitted from the module 550.

The actuator cavity 552 is typically drilled through and a diaphragm material 559 is lithographically deposited onto the back side 561 of the substrate 551 to cover the cavity 552. Alternatively, cavity 552 could be formed in the same manner as hole 553 and comprise one of a series of interconnected plena through which an external driver causes the necessary oscillatory flow for synthetic jet operation to occur, as discussed in Section "E" below. The diaphragm 559 may comprise a polymide film which is then electroplated with a metallic layer constituting one electrode for electrostatic actuation. The diaphragm 559 will be actuated by an electrostatic or electromagnetic actuation force to create periodic motion of the diaphragm 559. This motion will alternatively increase and decrease the volume of the actuator cavity 552.

A second substrate element 562 is also employed in the third preferred embodiment 550. Two holes 563, 564 are drilled in the substrate 562. A pressure sensor 554 is formed using micromachining techniques adjacent to a back side 566 of the second substrate 562 such that the sensor 554 covers one end of a first cavity 564 and a modulator 567 is formed, possibly by micromachining techniques, and positioned such that it covers a second, or orifice cavity 563 drilled in the second substrate element 562. The pressure sensor 554 detects changes in the static pressure of the external environment 568 and transmits this data to a control system (not depicted), such as a microprocessor. Data transmission occurs over circuitry 569 formed in the back side 566 of the second substrate 562 for mating with other, similar (or dissimilar) synthetic jet modules.

The modulators 567 mentioned above are designed to move such as to cover and/or uncover a mouth portion of the orifice cavity 563 as desired. The modulators 567 may be designed as a "flap" attached to the substrate by a hinge-like mechanism. Alternatively, a modulator may be designed to "slide" over the orifice and then "slide" away from the orifice. An electrical impulse preferably controls the modulator motion.

Typically, modulators are designed in three basic types: vertical drive, lateral drive, and constricting modulators. The vertical drive devices move in the direction of the jet flow in order to seal the orifice hole. They are the simplest to fabricate, but in order to operate they must have sufficient actuation force to overcome the pressure which is driving the synthetic jet. Thus, they may be more appropriate for modest jet velocities. The lateral drive devices can be thought of as "shutters" which slide in and out to partially or totally occlude a jet orifice cavity mouth. Since these devices are moving laterally with respect to the jet motion, smaller force is required. In addition, due to the nature of the synthetic jet, there is a point in time during each cycle that the jet pressure is zero. By timing actuation to occur during this "zero-crossing" of the jet, lateral actuation can be achieved. Constriction modulators may be in the form of an "inflatable," or inwardly radially constricting, ring. This resembles a lateral drive modulator; however, a jet's orifice is obstructed from more than one side at once. If required, the approaches are compatible with standard overpressure stops to prevent damage to the modulators.

The first and second substrates 551, 562 are then bonded together (or otherwise attached) such that the cavity 553 for the pressure sensing element 554 is about a back side of the sensor element 554 and the actuator cavity 552 is in fluid communication with the orifice cavity 563 fashioned in the second substrate 562. Obviously, the completed module 550 is designed to be used in conjunction with similar modules. An array is thus formed by joining many of these modules 550 together or by fashioning many such modules on a large area substrate using large area batch fabrication techniques.

Figure 9:
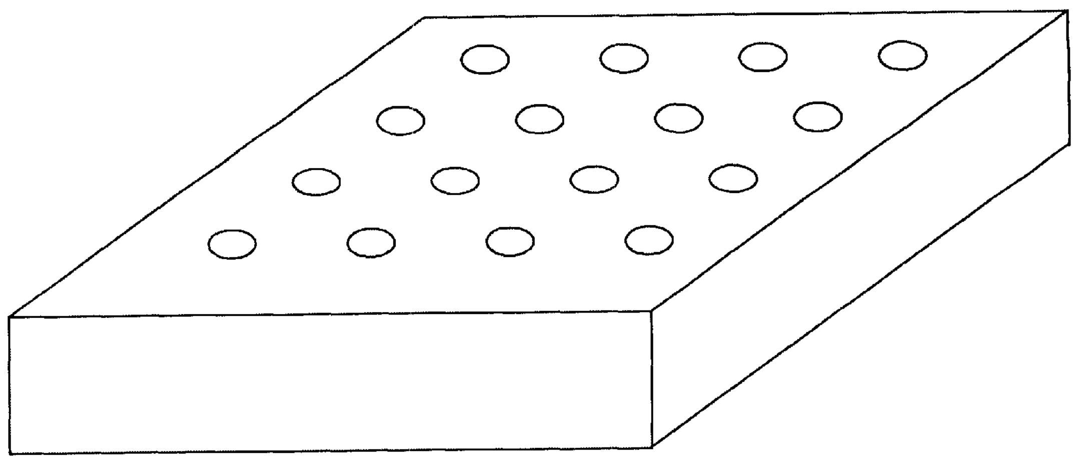
FIG. 9 is a perspective view of an array of microjet actuators made according to the device of FIG. 7B.

FIG. 9 is a perspective view of the above-described third preferred embodiment for a microjet array made using robust fabrication techniques. On a top surface of the array, only the holes 563, 564 for microjet generation or ambient sensing are evident. One interesting feature of this array is that all of the MEMS devices (sensors 554, modulators 567, microjet drivers 559, and connection points for integrated circuitry 557, 569) are located underneath the orifice holes 563, access holes 564, or plates, and that none of these devices need be directly exposed to an embedding flow. This arrangement is advantageous both for protection of the MEMS devices as well as the fact that the MEMS devices are packaged simultaneously with their fabrication, minimizing or eliminating a potentially costly separate packaging process.

D. Fourth Preferred Embodiment of a Microjet Array

FIGS. 10A–10J depict a fourth preferred embodiment and typical fabrication sequence for a microjet array 710 according to this fourth preferred embodiment. This embodiment combines aspects of traditional packaging and micromachining technologies to realize the depicted structure.

Figure 10A:
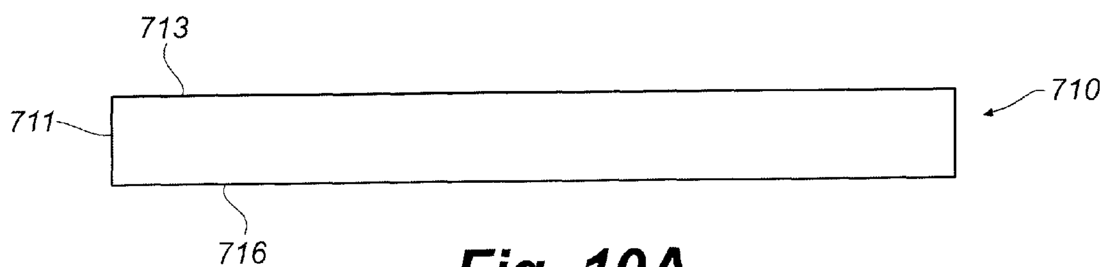
FIG. 10A is a cut-away side view of a plate for forming a microjet array.
Figure 10B:
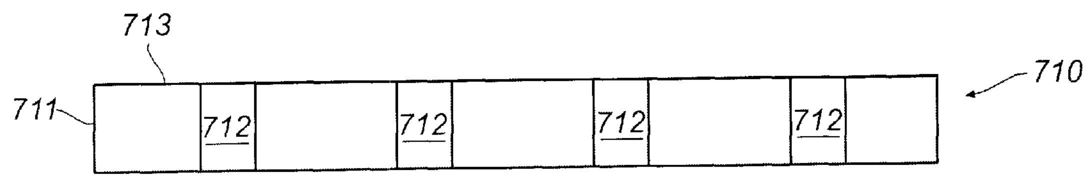
FIG. 10B is a cut-away side view the plate of FIG. 10A perforated with holes.
Figure 10C:
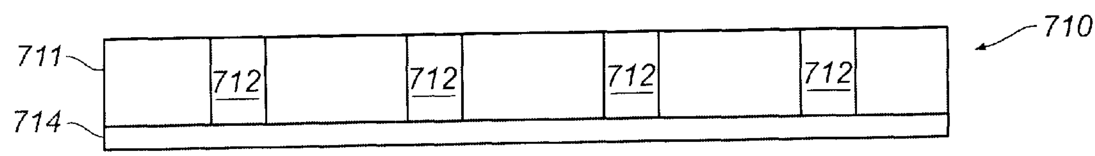
FIG. 10C is a cut-away side view of the perforated plate of FIG. 10B having a diaphragm material laminated to the plate.

Preferably, a metallic plate 711 having a front surface 713 and back surface 716 is used as a base for the microjet array 710 in FIG. 10A. The plate 711 may comprise a material such as stainless steel. The plate 711 of FIG. 10B is then perforated with holes 712 in its front surface 713. The holes 712 are typically formed using standard hole formation techniques such as drilling, laser ablation, or etching. Once holes 712 are formed in the plate 711, a thin sheet of material 714 acting as a diaphragm is then laminated onto the back surface 716 of the plate 711. See FIG. 10C. The base 711 with diaphragm material 714 laminated on its back side 716 forms the substrate for subsequent surface micromachining processes to form an array of microjet actuators.

Figure 10D:
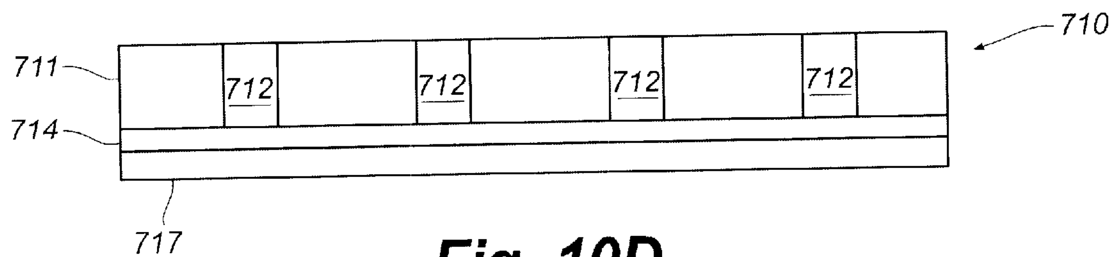
FIG. 10D is a cut-away side view of the microjet substrate depicted in FIG. 10C having a photosensitive film laminated to or deposited on the diaphragm material.
Figure 10E:
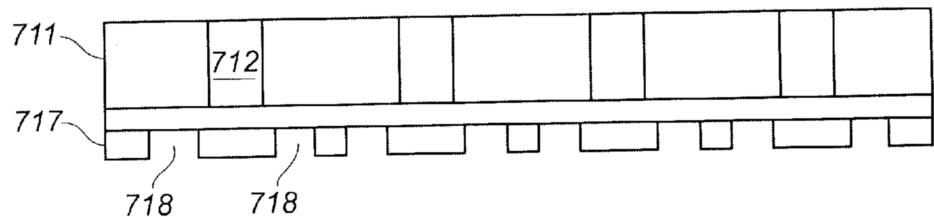
FIG. 10E is a side cut-away view of the device depicted in FIG. 10D where the photosensitive film has been patterned.
Figure 10F:
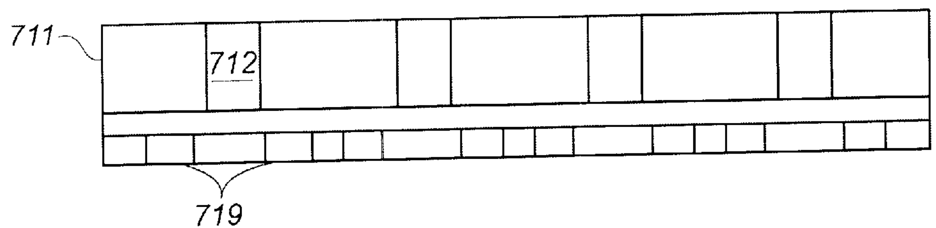
FIG. 10F is a cut-away side view of the patterned substrate of FIG. 10E after the patterns have been filled with electroplated metal.
Figure 10G:
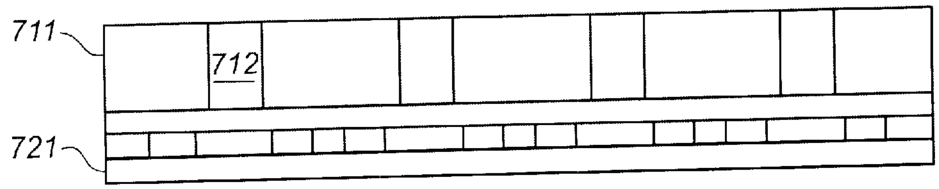
FIG. 10G is a cut-away side view of the device in FIG. 10F with an additional photosensitive film laminated to or deposited on the substrate.
Figure 10H:
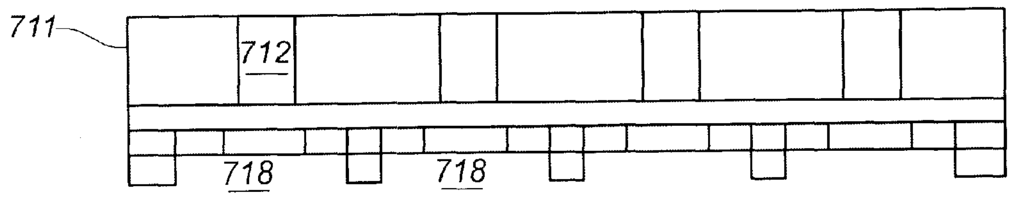
FIG. 10H is a side cut-away view of the device depicted in FIG. 10G where the additional photosensitive film has been patterned.
Figure 10I:
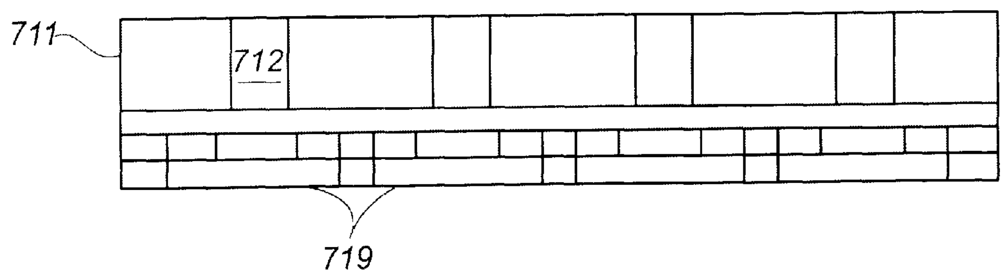
FIG. 10I is a cut-away side view of the patterned substrate of FIG. 10H after the patterns of the additional photosensitive film have been filled with electroplated metal.
Figure 10J:
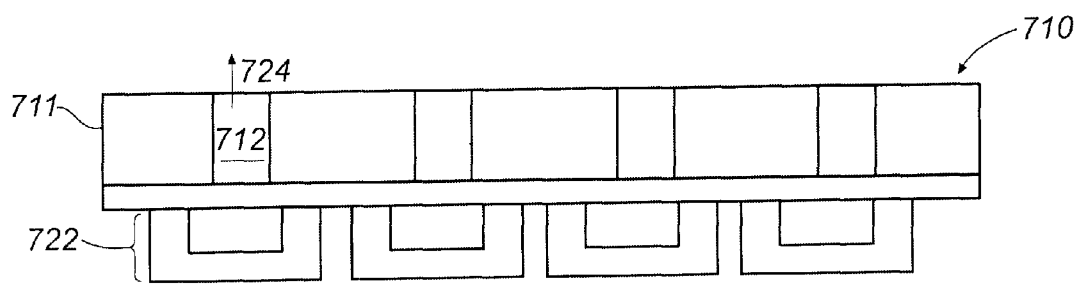
FIG. 10J is a cut-away side view of the device of FIG. 10I after the photosensitive films have been selectively released.

FIG. 10D depicts the deposition of a photosensitive film 717 onto the laminated film 714. This photosensitive film 717 is then patterned (FIG. 10E) using standard photolithographic techniques. The patterns 718 are then filled with electroplated metal to form standoffs 719 (FIG. 10F), which are insulated from the laminated film 714 using isolation techniques well known in the art, such as the deposition of a thin, nonconducting film between the laminated film 714 and the photosensitive film 717, if the laminated film 714 is electrically conducting. A second photosensitive film 721 is then deposited (FIG. 10G), patterned (FIG. 10H), and the patterns filled with electroplated material (FIG. 10I). The photosensitive films 717, 721 are then selectively released creating a freestanding micromachined 'bridge' 722 opposite to the laminated film 714 and orifice hole 712 (FIG. 10J).

Application of a sinusoidal voltage between the micromachined structure, or 'bridge' 722 and the laminated film 714 (or an electrode on the laminated film 714) will cause vibration of the diaphragm 714. The vibration alters the volume in the chamber consisting of the hole 712, which produces a synthetic jet stream 724 as described in detail above. Alternatively, the micromachined devices 722 formed on the substrate (FIG. 10C) could be modulators and/or sensors, fabricated using standard micromachining techniques on these specialized substrates.

A preferred application of the fourth preferred embodiment is to fabricate and use the large-area microjet array for electronic cooling applications. In this preferred application, the actuator preferably consists of a corrugated parylene membrane carrying a stencil-printed or conventional permanent magnet, and is approximately 1 cm in diameter. A planar coil for either electromagnetic actuation or electromagnetic sense of the magnet position (for control applications) is fabricated on the other side of the substrate. A commercially available printed circuit board with a single copper layer is used as substrate material. In a first step, 1 cm recess holes defining the final membrane sizes are drilled into the laminated epoxy board from the backside. Additional 1 mm holes are drilled through the substrate in the membrane center to allow the final sacrificial layer etch. A copper foil is laminated onto the backside of the epoxy substrate in a press with a force and temperature of 3.125 tons and 100° C., respectively. The lamination process forms circular copper membranes with a diameter of 1 cm suspended over the recess holes. A corrugation profile and a flat zone in the membrane center are then etched into the copper layer. The 14 circular corrugations have a height of 80 $\mu$m and a period of 200 $\mu$m. Then, a 2 $\mu$m parylene film is deposited by plasma coating on top of the corrugated copper membranes. Polymer permanent magnets with a diameter of 4 mm, and a thickness of 1 mm are stencil-printed onto the flat zone in the membrane center. After curing and remagnetizing the magnets, the copper in the area of the diaphragms is etched through the 1 mm holes in a ferric chloride solution. Planar coils are fabricated on the opposite side of the substrate using standard photolithography. The planar, square coil consists of 31 turns with a wire thickness of 15 $\mu$m, and a width and spacing of 40 $\mu$m. The planar coils have a typical resistance of 20 to 30 Ohms. Instead of a stencil-printed polymer magnet, a commercially available Nd—Fe—B magnet can be mounted in an hybrid fashion onto the parylene diaphragms.

E. Fifth Preferred Embodiment for a Microjet Actuator Array

All of the microjet arrays described above comprise individual control of a volume changing mechanism for each individual actuator cavity to individually control the synthetic jet streams emitting from the various orifices. However, a microjet actuator array may be fabricated to comprise a global volume changing mechanism. Individual control of the microjet actuators in the array is accomplished through modification of orifice openings with modulators or louvers, which may themselves be micromachined.

Figure 11A:
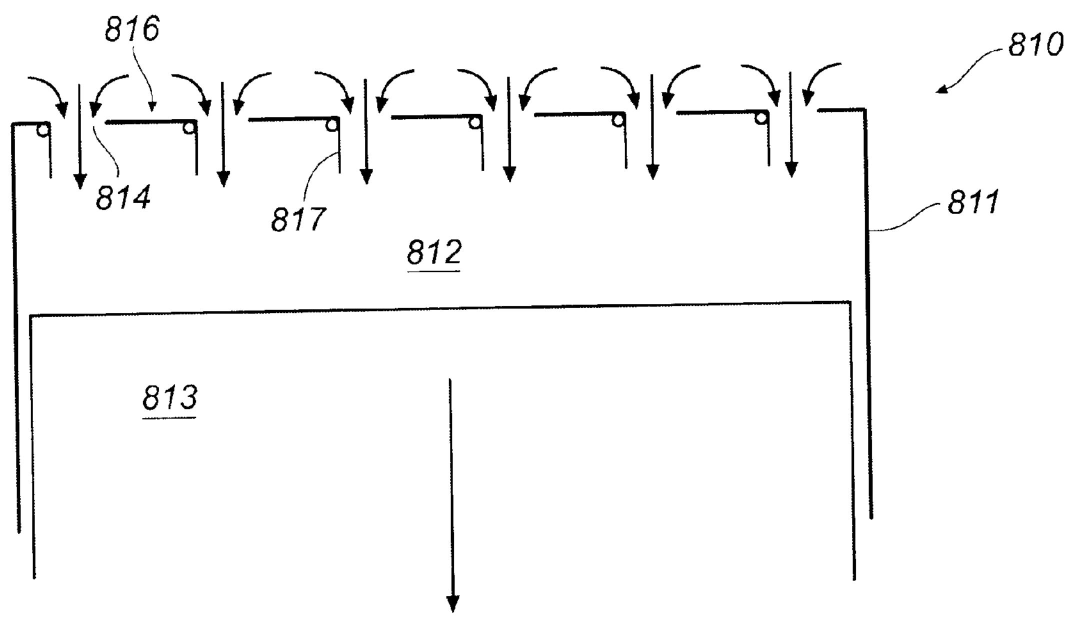
FIG. 11A is a cut-away side schematic view of a globally actuated microjet array forming a plurality of synthetic jet streams.
Figure 11B:
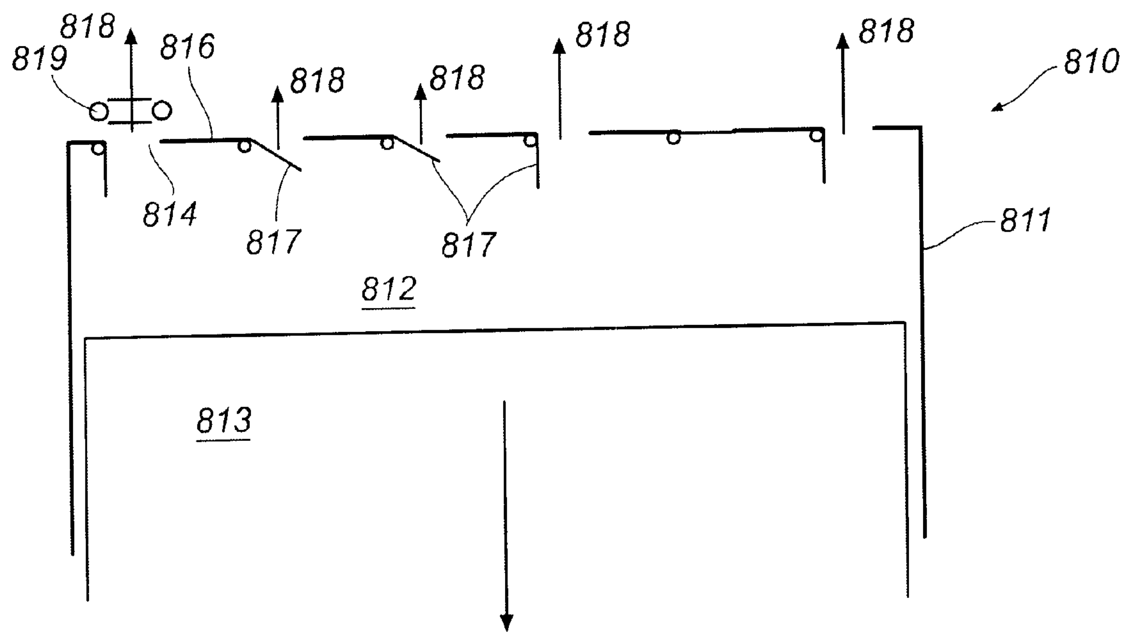
FIG. 11B is a cut-away side schematic view of the globally actuated microjet array depicted in FIG. 12A while the device is drawing ambient fluid into an internal chamber through a series of orifices.

A preferred embodiment of a global microjet actuator array 810 is depicted in FIGS. 11A–11B. This fifth preferred embodiment for a microjet array 810 comprises a housing 811 defining a cavity 812. A volume of the cavity 812 is altered by a volume changing means 813. Preferably, the volume changing means 813 comprises a piezoelectric element or a piston element. A piston-like device 813 is shown in FIGS. 11A–11B. However, the volume changing means may comprise an electromechanical or magnetic force, as well as a combustion force.

The housing 811 of the second preferred embodiment 810 comprises multiple orifices 814 in a wall 816 of the housing 811. These orifices 814 preferably have individually controllable louvers or modulators 817 about the orifice 814. In that way, flow through the orifices 814 may be controlled individually by the louvers or modulators 817. The volume changing means 813 preferably periodically changes the volume of the cavity 812. As the volume is increased (FIG. 11A), ambient fluid 818 is drawn through the orifices 814 and into the cavity 812. As the volume is subsequently decreased (FIG. 11B), the fluid 818 is forced out through the orifices 814 that are open (i.e. not obstructed by modulators or louvers 817), forming vortex sheets at the orifices, which roll up into vortices 819. These vortices 819 move away from the orifices 814 and entrain an ambient fluid 818 into a synthetic jet stream 818 (FIG. 11B).

III. Typical Example Application of Micromachined Synthetic Jet Actuators

A preferred application for any of the micromachined, or batch fabricated, synthetic jet actuators described above is use of such microjets embedded in various solid bodies in fluid flow fields. The microjets can effectively alter the apparent aerodynamic shape of the solid body. Although the apparent shape of any body may be modified, the preferred application is with wings, rotor blades, stabilizer surfaces, or other aerodynamic surfaces in a fluid flow.

Figure 2A:
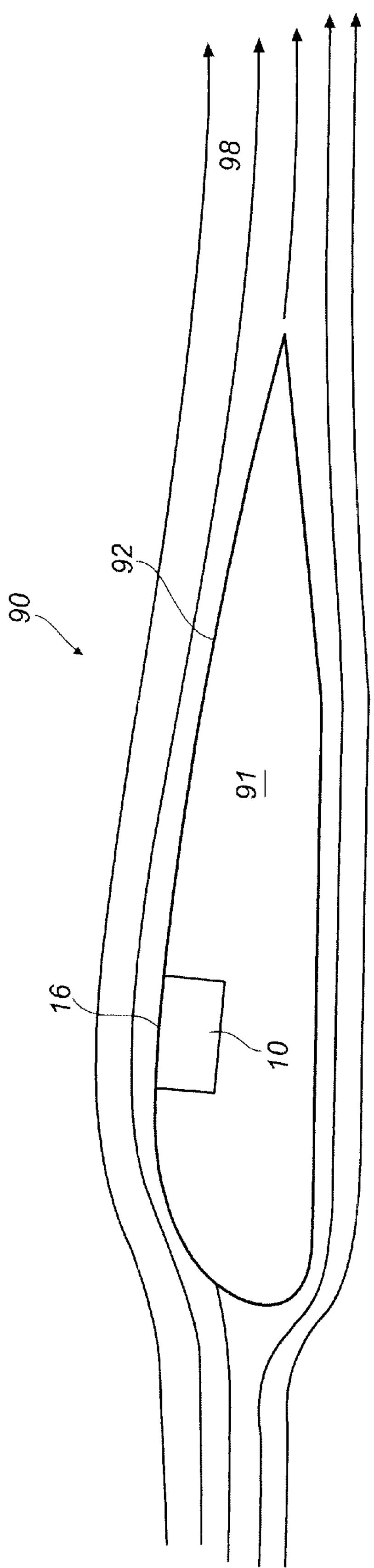
FIG. 2A is a schematic cross-sectional side view of a wing with the synthetic jet actuator of FIG. 1A embedded in the wing.

FIG. 2A depicts a simple schematic of the basic physical interaction between a microjet actuator and the flow about an airfoil. In this embodiment 90, a microjet actuator 10 is embedded in an airfoil 91 such that a microjet orifice 16 is flush with an external surface, or skin 92, of the airfoil 91. The positioning of the orifice 16 along the airfoil skin can be determined based on the particular effect on the flow desired. The airfoil 91 is placed in a freestream of fluid, as depicted by the arrow 94. The flow of the fluid 94 about the airfoil 91 is depicted by the set of streamlines 98. As depicted, the airfoil 91 is at zero degrees angle of attack, and the airfoil 91 is symmetric about its chord line. While the embodiment depicted in FIG. 2A is at zero degrees angle of attack, the present invention also functions appropriately at other angles of attack. For example, at higher angles of attack, the separation performance of a wing can be controlled and/or tailored.

Figure 2B:
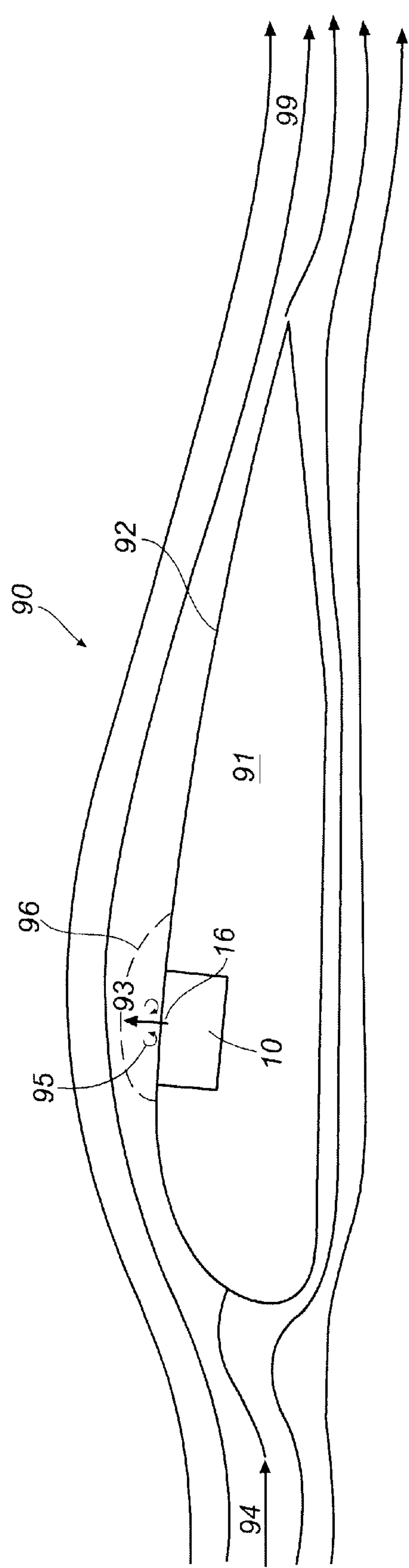
FIG. 2B is a schematic cross-sectional side view of the wing of FIG. 2A in operation showing the modification of fluid flow resulting from the synthetic jet actuator of FIG. 1A.

FIG. 2B. shows the embodiment 90 when the microjet actuator 10 is operational. When operational, the microjet actuator 10 forms a fluid flow as depicted by arrow 93 normal to the orifice 16 in the airfoil skin 92. Because the microjet actuator 10 does not inject any new fluid into the freestream flow 94, a closed recirculating flow region 95 is formed adjacent to the airfoil skin 92. This region 95 is depicted in FIG. 2B as bounded by the broken line 96. Because this recirculating region 95 is closed, the aerodynamic shape of the airfoil surface 92 is effectively modified. The new effective shape is depicted by the airfoil skin 92 with the addition of the broken line 96, representing the closed region of flow 95. Because of the airfoil surface modification, the streamlines 99 of the freestream flow 94 will flow over the recirculating region 95, defined by the broken line 96, just as if the broken line 96 were a solid part of the airfoil skin 92. Thus, the aerodynamic characteristics of the airfoil 91 are changed by operation of the microjet actuator 10.

It has been discovered by experimentation that the presence of the microjet actuator 10 in the airfoil 91 causes an alteration of the static pressure distribution along the surface of the airfoil 91. The surface of the airfoil 91 just upstream of the actuator's recirculation region and just downstream of the recirculation region experience a decrease in static surface pressure. The surface of the airfoil 91 under the recirculation region experiences an increase in downward pressure force. However, the area experiencing an increase in static pressure is relatively small and therefore, the net lift force is augmented. In contrast, a non-synthetic jet actuator ejecting fluid normal to an airfoil in a flow field would cause a decrease in static pressure downstream of the jet orifice, but an increase in static pressure upstream of the jet orifice.

Figure 8A:
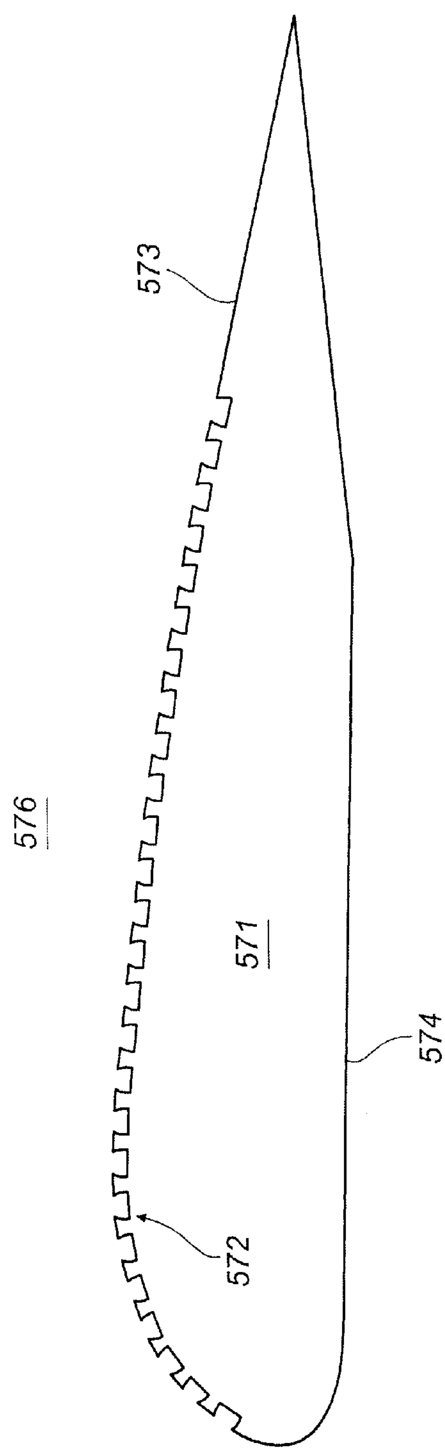
FIG. 8A is a schematic cross-sectional side view of a wing with an array of micromachined synthetic jet actuators embedded the wing such as to project one or more synthetic jet streams outward from the wing.

FIGS. 2A–2B depict a simple illustration of this preferred application. However, the preferred embodiment for microjet actuators involves an array of actuators in a wing 571 where the substrate of the microjet actuator array actually forms the skin of the airfoil. FIG. 8A depicts such a situation where an array of microjets 572 are distributed along an upper surface 573 of the wing 571. However, the microjets 572 could just as easily be distributed along the lower surface 574 of the wing 571, or along both upper and lower surfaces.

As depicted in FIG. 8A, many microjet orifices open to the external environment 576. Since the microjets 572 are individually addressable, all, or only a select portion of the microjets may be activated at one time. In this way, the apparent aerodynamic shape of the wing 571 may be specifically tailored to a given flight regime. If the microjets 572 have pressure, or other appropriate sensors, as depicted in FIGS. 7A and 7B, then a control computer can evaluate the forces on the wing during flight and determine the appropriate microjets to activate in order to optimally tailor the apparent aerodynamic shape of the airfoil.

Figure 8B:
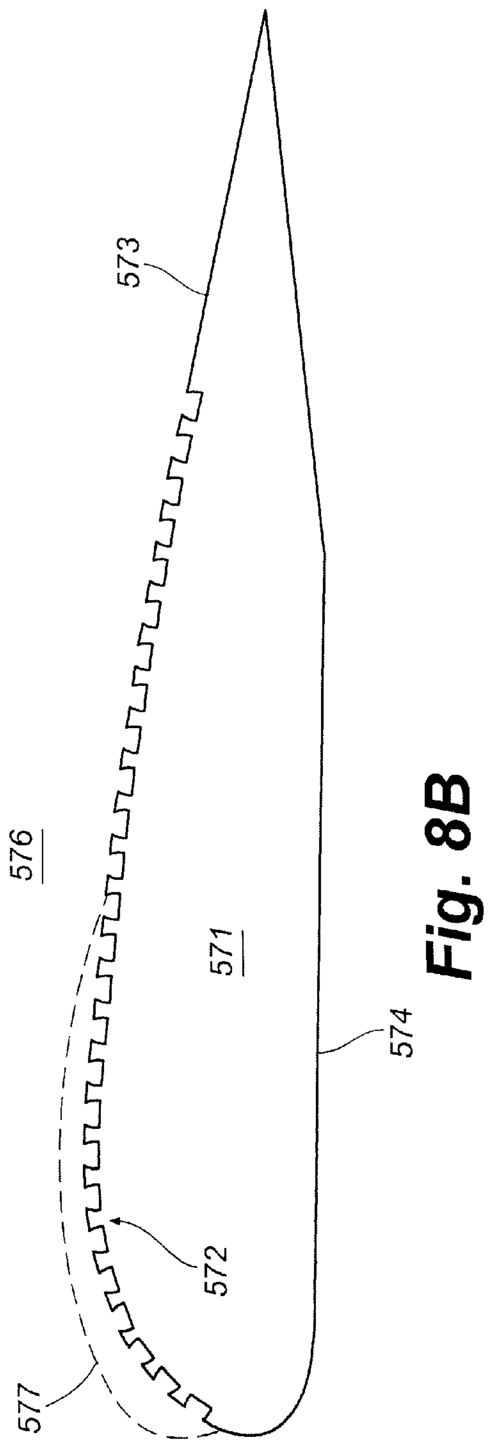
FIG. 8B is a schematic cross-sectional side view of a wing with an array of micromachined synthetic jet actuators embedded the wing while a series of the micromachined synthetic jet actuators are operational and forming a closed recirculation region along the surface of the wing.

FIG. 8B depicts the situation where several of the microjets 572 in the array are activated. Specifically, the microjets 572 along the upper leading edge of the wing 571 are activated. A closed recirculation region 577 is formed along the upper surface 573 directly adjacent to the active microjets. This region 577 actually penetrates the boundary layer of the flow about the wing 571 and thereby modifies the apparent aerodynamic shape. This changes the effective camber, and in turn, alters the lift and drag forces on the wing 571. Of course, this is only an example, and any combination of microjets may be activated at one time, as desired, in a given flight regime.

We claim:

1. A micromachined synthetic jet apparatus placed in an environment having an ambient fluid, comprising:

(a) a substrate material defining a cavity having a volume of the ambient fluid and one orifice on a face of said substrate for allowing fluid communication between said cavity and the environment; and (b) a volume changing means for changing a volume within said cavity so that when said cavity volume is increased, a portion of the ambient fluid is drawn into said cavity, and when said cavity volume is decreased a portion of the ambient fluid is emitted from said orifice and forms a series of fluid vortices projected in the environment out from the orifice, wherein said vortices entrain a portion of the ambient fluid thereby generating a synthetic jet stream.

2. The apparatus of claim 1, wherein said cavity volume is changed periodically by said volume changing means.

3. The apparatus of claim 2, wherein said substrate is a silicon based material.

4. The apparatus of claim 3, wherein said volume changing means comprises:

a flexible membrane, said membrane constituting at least a portion of a housing surrounding said cavity; and an actuation means for causing said membrane to vibrate in periodic motion.

5. The apparatus of claim 4, wherein said actuation means comprises:

(a) said membrane having a sputtered layer of aluminum, said layer of aluminum acting as an electrode for electrostatic actuation; and (b) a power supply for applying a charge across said film and causing said film to oscillate in time-harmonic motion.

6. The apparatus of claim 2, wherein said substrate comprises a metallic material.

7. The apparatus of claim 6, wherein the cavity is formed by drilling into said metallic material.

8. The apparatus of claim 7, wherein said volume changing means comprises:

(a) a flexible film forming a diaphragm, said diaphragm constituting at least a portion of a housing surrounding said volume and said diaphragm electroplated with a metallic layer; and (b) an actuation means for causing said film to vibrate in periodic motion.

9. The apparatus of claim 8, further comprising a modulator for modifying the flow through said orifice.

10. The apparatus of claim 9, wherein said modulator comprises a vertical drive modulator.

11. The apparatus of claim 9, wherein said modulator comprises a lateral drive modulator.

12. The apparatus of claim 9, wherein said modulator comprises a radially constricting modulator.

13. A micromachined fluid control system, comprising:

(a) a substrate material, and (b) at least one synthetic jet actuators formed in said substrate material, each said actuator having:

(1) a housing defining an internal cavity for holding a volume of fluid and one opening in said actuator housing connecting said cavity to an external environment having said fluid, and (2) a means for periodically changing, said volume within said internal cavity so that a series of fluid vortices forming vortex sheets are generated and projected in said external environment out from said opening of said actuator housing, wherein said vortex sheets entrain said fluid in said external environment thereby forming, a synthetic jet stream projecting outwardly from said actuator housing.

14. The fluid control system of claim 13, wherein said actuator housing is formed essentially from a silicon wafer by means of anisotropic etching, and said volume changing means comprises:

(a) a polymide membrane bearing a metallic layer forming a wall of said actuator housing; and (b) a means for generating an electrical bias across said membrane for causing said membrane to oscillate in periodic motion.

15. The fluid control system of claim 13, further comprising a modulator for controlling the flow through the orifice.

16. A micromachined synthetic jet apparatus, said apparatus comprising:

a housing defining a cavity, said housing having an orifice for allowing fluid communication between said cavity and an exterior environment;

a wall forming a portion of said housing, said wall being moveable so as to increase and decrease a volume of said cavity in alternating fashion; and a control system for causing said wall to increase and decrease a volume of said cavity in alternating fashion, wherein when said volume is increased, a portion of an ambient fluid is drawn into said cavity and when said volume is decreased, a series of fluid vortices forms at said orifice, said vortices entraining a portion of said ambient fluid in an external environment, thereby generating a synthetic jet stream of ambient fluid.

17. The apparatus of claim 16, wherein said housing comprises a substrate material.

18. The apparatus of claim 17, wherein said wall comprises a flexible diaphragm, said flexible diaphragm bonded to said substrate material.

19. The apparatus of claim 18, wherein said substrate material comprises one orifice for allowing fluid communication between said cavity and said exterior environment.

20. A micromachined synthetic jet apparatus placed in an environment having an ambient fluid, comprising:

(a) a silicon based substrate material defining a cavity having a volume of the ambient fluid and one orifice on a face of said substrate for allowing fluid communication between said cavity and the environment, (b) a flexible membrane, said membrane constituting at least a portion of a housing surrounding said cavity, said membrane having a sputtered layer of aluminum, said layer of aluminum acting as an electrode for electrostatic actuation, and (c) a power supply for applying a charge across said layer of aluminum and causing said flexible membrane oscillate in time-harmonic motion thereby periodically changing a volume within said cavity so that when said cavity volume is increased a portion of the ambient fluid is drawn into said cavity, and when said cavity volume is decreased a portion of the ambient fluid is emitted from said orifice and forms a series of fluid vortices projected in the environment out from the orifice, wherein said vortices entrain a portion of the ambient fluid thereby generating a synthetic jet stream.

21. A micromachined synthetic jet apparatus placed in an environment having an ambient fluid, comprising:

(a) a metallic substrate material defining a cavity, wherein said cavity is formed by drilling into said metallic substrate material, said cavity having a volume of the ambient fluid and one orifice on a face of said substrate for allowing fluid communication between said cavity and the environment; and (b) a volume changing means for periodically changing a volume within said cavity so that when said cavity volume is increased, a portion of the ambient fluid is drawn into said cavity, and when said cavity volume is decreased a portion of the ambient fluid is emitted from said orifice and forms a series of fluid vortices projected in the environment out from the orifice, wherein said vortices entrain a portion of the ambient fluid thereby generating a synthetic jet stream.

22. The apparatus of claim 21, wherein said volume changing means comprises:

(a) a flexible film forming, a diaphragm, said diaphragm constituting at least a portion of a housing surrounding said volume and said diaphragm electroplated with a metallic layer; and (b) an actuation means for causing said film to vibrate in periodic motion.

23. The apparatus of claim 22, further comprising a modulator for modifying the flow through said orifice.

24. The apparatus of claim 23, wherein said modulator comprises a vertical drive modulator.

25. The apparatus of claim 23, wherein said modulator comprises a lateral drive modulator.

26. The apparatus of claim 23, wherein said modulator comprises a radially constricting modulator.

27. A microfabricated fluid control system, comprising:

(a) a substrate material, and (b) one or more synthetic jet actuators formed in said substrate material, each said actuator having:

(1) a housing defining an internal chamber for holding a volume of fluid and one opening in said actuator housing connecting said chamber to an external environment having said fluid, wherein said housing is formed essentially from a silicon wafer by means of anisotropic etching, (2) a polymide membrane bearing a metallic layer forming a wall of said actuator housing; and (3) a means for generating an electrical bias across said membrane for causing said membrane to oscillate in periodic motion so that a series of fluid vortices forming vortex sheets are generated and projected in said external environment out from said opening of said actuator housing, wherein said vortex sheets entrain said fluid in said external environment thereby forming a synthetic jet stream projecting outwardly from said actuator housing.

* * * * *

UNITED STATES PATENT AND TRADEMARK OFFICE

CERTIFICATE OF CORRECTION

PATENT NO. : 6,457,654 B1
DATED : October 1, 2002
INVENTOR(S) : Glezer et al.

It is certified that error appears in the above-identified patent and that said Letters Patent is hereby corrected as shown below:

Column 3,
Line 17, after "extension" insert -- of --.

Column 4,
Line 36, delete "fla0s" and replace with -- flaps --.

Column 6,
Line 52, delete "4o" and replace with -- to --.

Column 7,
Line 38, delete "4he" and replace with -- the --.

Column 10,
Line 1, delete "polymide" and replace with -- polyimide --.

Column 17,
Line 50, delete "-odification" and replace with -- modification --.

Column 20,
Line 28, delete "polymide" and replace with -- polyimide --.

Column 25,
Line 58, delete "polymide" and replace with -- polyimide --.

Column 28,
Line 5, delete "polymide" and replace with -- polyimide --.

Signed and Sealed this

Ninth Day of December, 2003

JAMES E. ROGAN
*Director of the United States Patent and Trademark Office*